United States Patent
Ando

(10) Patent No.: US 10,013,106 B2
(45) Date of Patent: Jul. 3, 2018

(54) INPUT TERMINAL

(71) Applicant: Murata Manufacturing Co., Ltd., Nagaokakyo-shi, Kyoto-fu (JP)

(72) Inventor: Masamichi Ando, Nagaokakyo (JP)

(73) Assignee: MURATA MANUFACTURING CO., LTD., Nagaokakyo-Shi, Kyoto-Fu (JP)

(*) Notice: Subject to any disclaimer, the term of this patent is extended or adjusted under 35 U.S.C. 154(b) by 21 days.

(21) Appl. No.: 15/386,708

(22) Filed: Dec. 21, 2016

(65) Prior Publication Data

US 2017/0102822 A1 Apr. 13, 2017

Related U.S. Application Data

(63) Continuation of application No. PCT/JP2015/066814, filed on Jun. 11, 2015.

(30) Foreign Application Priority Data

Jul. 2, 2014 (JP) .................................. 2014-136883

(51) Int. Cl.
*G06F 3/041* (2006.01)
*G06F 3/044* (2006.01)
(Continued)

(52) U.S. Cl.
CPC ............ *G06F 3/0416* (2013.01); *G06F 3/044* (2013.01); *H01L 41/047* (2013.01);
(Continued)

(58) Field of Classification Search
None
See application file for complete search history.

(56) References Cited

U.S. PATENT DOCUMENTS

| 8,978,469 | B2* | 3/2015 | Takaoka | ............. G01C 19/5769 73/504.12 |
| 2003/0227441 | A1* | 12/2003 | Hioki | .................. G06F 3/0412 345/156 |
| 2014/0347304 | A1* | 11/2014 | Ando | ..................... G06F 3/041 345/173 |

FOREIGN PATENT DOCUMENTS

| JP | 2004046792 A | 2/2004 |
| WO | WO 2013122070 A1 | 8/2013 |

OTHER PUBLICATIONS

International Search Report issued for PCT/JP2015/066814, dated Jul. 14, 2015.

(Continued)

*Primary Examiner* — Kenneth B Lee, Jr.
(74) *Attorney, Agent, or Firm* — Arent Fox LLP

(57) ABSTRACT

A panel of an input terminal that includes a base substrate having a first principal surface and a second principal surface opposing each other; a piezoelectric film having a third principal surface and a fourth principal surface opposing each other and made of a uniaxially stretched polylactic acid; and rigid bodies disposed at end portions of the first principal surface and the second principal surface of the base substrate so as to oppose each other across the base substrate and partially prevent a deformation caused by a twist of the base substrate. First displacement detection electrodes are formed on the first principal surface of the piezoelectric film and divide the first principal surface into four. Second displacement detection electrodes are formed on the second principal surface of the piezoelectric film and oppose the first displacement detection electrodes on the first principal surface.

20 Claims, 17 Drawing Sheets

(51) Int. Cl.
 *H01L 41/047* (2006.01)
 *H01L 41/113* (2006.01)
 *H01L 41/193* (2006.01)
(52) U.S. Cl.
 CPC .......... *H01L 41/113* (2013.01); *H01L 41/193* (2013.01); *G06F 2203/04102* (2013.01)

(56) References Cited

OTHER PUBLICATIONS

Written Opinion of the International Searching Authority issued for PCT/JP2015/066814, dated Jul. 14, 2015.

* cited by examiner

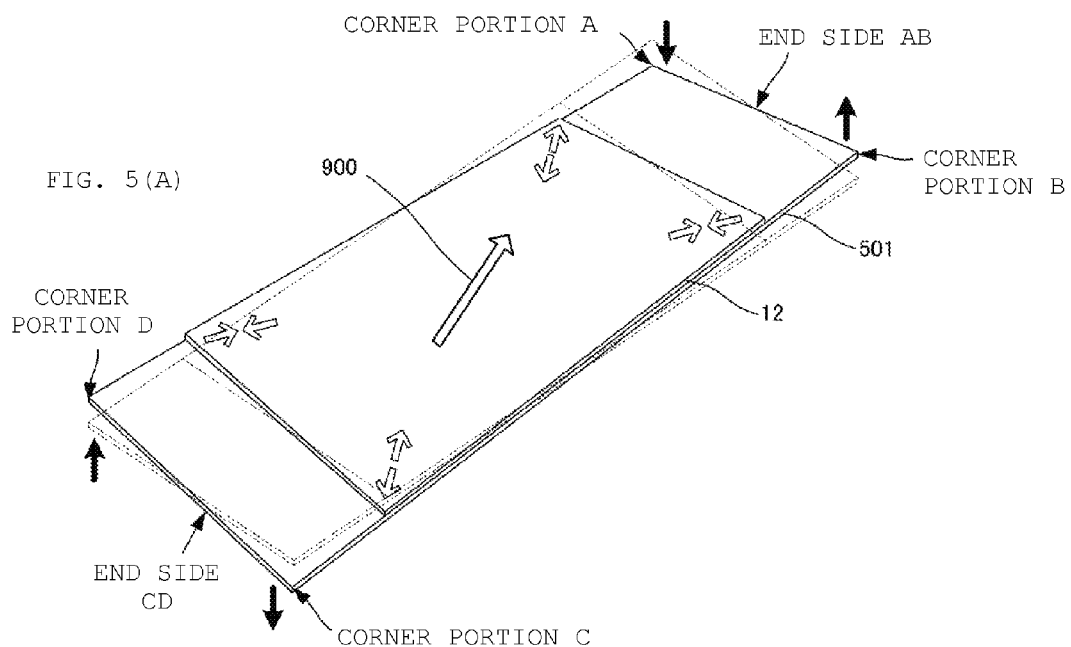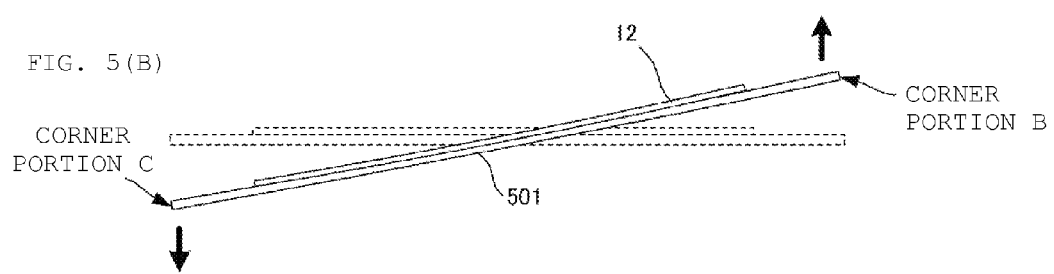

| DISPLACEMENT STATE | V(ReA) | V(ReB) | V(ReC) | V(ReD) |
|---|---|---|---|---|
| BEND (+a) | +VBa | +VBa | +VBa | +VBa |
| BEND (+b) | +VBb | +VBb | +VBb | +VBb |
| BEND (-a) | -VBa | -VBa | -VBa | -VBa |
| TWIST (+c) | +VWc | -VWc | +VWc | -VWc |
| TWIST (+d) | +VWd | -VWd | +VWd | -VWd |
| TWIST (-c) | -VWc | +VWc | -VWc | +VWc |

INPUT TERMINAL

CROSS REFERENCE TO RELATED APPLICATIONS

The present application is a continuation of International application No. PCT/JP2015/066814, filed Jun. 11, 2015, which claims priority to Japanese Patent Application No. 2014-136883, filed Jul. 2, 2014, the entire contents of each of which are incorporated herein by reference.

FIELD OF THE INVENTION

The present invention relates to an input terminal which detects a user's operation input.

BACKGROUND OF THE INVENTION

Conventionally, various input terminals (devices) have been devised which enable not only an input made by an operator's touch on an operation surface but also diverse operation inputs. For example, an input device disclosed in Patent Document 1 includes a touch position detection panel, a piezoelectric film which is made of poly-L-lactic acid (PLLA) uniaxially stretched to prevent an influence of pyroelectricity, and displacement detection electrodes which detect a bend displacement and a twist displacement of the piezoelectric film. According to this configuration, the input device disclosed in Patent Document 1 detects a direction and a displacement amount of the bend displacement and the twist displacement based on a touch position, a pressing force with respect to the touch position and, in addition, a voltage produced between the displacement detection electrodes by the displacement of the piezoelectric film.

Patent Document 1: International Publication No. 2013/122070

SUMMARY OF THE INVENTION

However, the input terminal disclosed in Patent Document 1 frequently causes erroneous detection due to noise since a voltage produced by a twist displacement is significantly low compared to a voltage produced by a bend displacement when a uniaxial stretching direction of PLLA forming the piezoelectric film, and a longitudinal direction or a lateral direction form an angle of 45°.

Meanwhile, it is known that, when the angle formed between the uniaxial stretching direction of the PLLA forming the piezoelectric film and the longitudinal direction is 0°, a voltage produced by a twist displacement is significantly high compared to a voltage produced by a bend displacement. Hence, there is a method for simply overlaying two piezoelectric films made of PLLA in different uniaxial stretching directions to increase a voltage level produced by a twist displacement. However, overlaying two bend displacement and twist displacement detecting sensors simply doubles a piezoelectric film layer and increases an electrode layer. Therefore, the thickness of the entire device increases, and transparency significantly lowers. Further, there is a problem that there are multiple manufacturing processes and cost increases. Meanwhile, in case of one of the sensors, a signal detection circuit needs to perform a special treatment of making appropriate a difference between strengths of detection signals to detect both of a bend displacement and a twist displacement.

An object of the present invention is to provide an input terminal which can detect a bend displacement and a twist displacement while adopting a simple structure without increasing a film thickness in a lamination direction.

An input terminal according to a first embodiment of the present invention includes: a base substrate having a flat shape and including a first principal surface and a second principal surface opposing each other; a piezoelectric film having a flat film shape and including a third principal surface and a fourth principal surface opposing each other, the third principal surface facing the second principal surface of the base substrate; and displacement detection electrodes formed on the third principal surface and the fourth principal surface of the piezoelectric film and which detect voltages produced by a bend displacement of the piezoelectric film. Rigid bodies are disposed at end portions of the first principal surface and the second principal surface of the base substrate and oppose each other across the base substrate to partially prevent a deformation caused by a twist of the base substrate.

An input terminal according to a second embodiment of the present invention includes: a base substrate having a flat shape and includes a first principal surface and a second principal surface opposing each other; a piezoelectric film having a flat film shape and including a third principal surface and a fourth principal surface opposing each other, the third principal surface facing the second principal surface of the base substrate; and displacement detection electrodes formed on the third principal surface and the fourth principal surface of the piezoelectric film and which detect voltages produced by a bend displacement of the piezoelectric film. Rigid bodies which are disposed at end portions of the first principal surface and the second principal surface of the base substrate, oppose each other across the base substrate, and extend in a direction intersecting a direction of a deformation caused by a twist of the base substrate.

According to these configurations, it is possible to detect a displacement of the piezoelectric film based on a voltage distribution by using a voltage which is outputted from each of the displacement detection electrodes and individually changes in response to the displacement of the piezoelectric film. When, for example, the piezoelectric film is bent in a predetermined direction and is twisted, different voltage distributions are provided. Consequently, by detecting this voltage distribution, it is possible to detect that the piezoelectric film has been bent or twisted, i.e., that the piezoelectric film has been displaced. Consequently, it is possible to realize the input terminal which enables an operation input by displacing (e.g. bending, twisting or the like) the input terminal.

Further, when the rigid bodies are disposed along the end portions of the base substrate and an external force causing a twist is applied to a panel, a surface of the base substrate is partially prevented from stretching and contracting near the rigid bodies, and an orientation of a stretching and contracting direction of the piezoelectric film is partially changed. Consequently, it is possible to obtain a high output of a voltage produced by a twist displacement which is a significantly low output in comparison with a voltage produced by a bend displacement. It is possible to detect the twist displacement with a high sensitivity similar to the bend displacement and, consequently, lower a probability that noise or the like is erroneously detected. Further, one piezoelectric film can detect both of the bend displacement and the twist displacement, and it is not necessary to overlay two piezoelectric films for a bend displacement and a twist displacement. Consequently, it is possible to realize a thin input terminal without increasing the film thickness in a laminating direction.

The displacement detection electrodes are preferably divided into a plurality of areas along a first direction of the first principal surface or the second principal surface, and are divided into a plurality of areas along a second direction orthogonal to the first direction. According to this configuration, a plurality of displacement detection electrodes is formed along the first direction and the second direction, i.e., four or more displacement detection electrodes are formed in different areas on the piezoelectric film. According to this configuration, it is possible to obtain individual voltage distributions from a plurality of types of displacements (bends, twists, and the like) of different displacement patterns. Consequently, it is possible to individually detect a plurality of types of displacements.

Preferably, the piezoelectric film is made of polylactic acid uniaxially stretched in a direction parallel to the first principal surface and the second principal surface, and a direction of the uniaxially stretching of the piezoelectric film is a direction which forms a predetermined angle with respect to the first direction and the second direction. This configuration indicates a specific use mode of the piezoelectric film for which polylactic acid is used. Consequently, by optionally setting the uniaxial stretching direction, it is possible to appropriately set a sensitivity of the piezoelectric film with respect to a displacement which needs to be detected.

Preferably, the rigid bodies are formed at both end portions of the piezoelectric film in the first direction and along the second direction. According to this configuration, an orientation of a stress near the rigid bodies produced by a twist displacement is in the same direction as an orientation of a stress produced when the piezoelectric film is bent along the second direction. Consequently, it is possible to detect the twist displacement with a high sensitivity similar to the bend displacement.

The input terminal according to the present invention includes: a touch position detection panel including a main body having a flat film shape and including a third principal surface as an operation surface and a fourth principal surface opposing to the third principal surface, and capacitance detection electrodes formed on the third principal surface and the fourth principal surface, the first principal surface and the second principal surface, and the third principal surface and the fourth principal surface are disposed nearly overlapping each other when seen from the operation surface. According this configuration, it is possible to realize the input terminal which enables an operation input on the operation surface of the touch position detection panel, and an operation input obtained by displacing (bending, twisting or the like) the input terminal. Further, in this case, the touch position detection panel and the piezoelectric film have the flat film shapes, so that it is possible to realize the thin input terminal.

Preferably, the capacitance detection electrodes and the displacement detection electrodes of the input terminal according to the present invention are formed on an identical plane. According this configuration, the capacitance detection electrodes and the displacement detection electrodes are formed in the same layer. Consequently, it is not necessary to provide the base substrate between the capacitive sensor and the piezoelectric sensor and realize a thinner input terminal.

Further, the main body of the touch position detection panel of the input terminal according to the present invention is formed by the piezoelectric film, and the capacitance detection electrodes and the displacement detection electrodes are formed on the identical plane. According to this configuration, the main body of the touch position detection panel is the piezoelectric film, and the capacitance detection electrodes and the displacement detection electrodes are formed on one surface of the piezoelectric film. Consequently, it is possible to realize a thinner input terminal.

The present invention can configure an input terminal which can detect a bend displacement and a twist displacement while adopting a simple structure without increasing the thickness of a film in a lamination direction.

BRIEF EXPLANATION OF THE DRAWINGS

FIG. 5(A) is a perspective view illustrating a state where the panel 20 which does not include the rigid body is twisted.

FIG. 5(B) is a side view illustrating a state where the panel 20 which does not include the rigid body is twisted.

DETAILED DESCRIPTION OF PREFERRED EMBODIMENTS OF THE INVENTION

Figure 1:
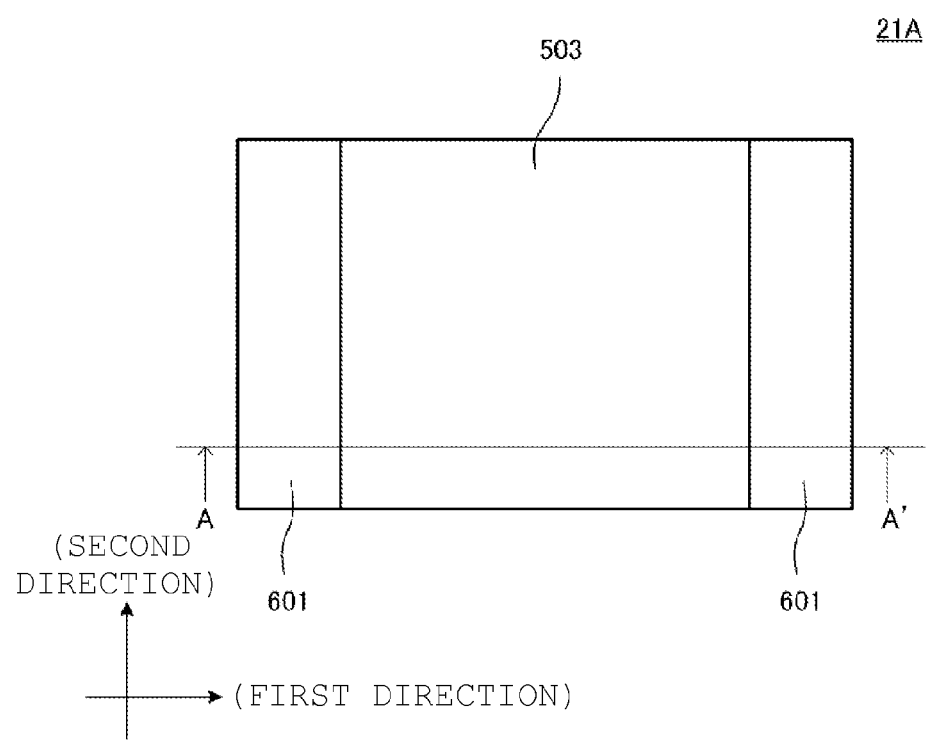
FIG. 1 is a plan view of a panel 21A of an input terminal 1 according to a first embodiment of the present invention.

A plurality of embodiments for carrying out the present invention will be described by using some specific examples with reference to the drawings. The same portions in each drawing will be assigned the same reference numerals. Naturally, each embodiment is exemplary, and components described in different embodiments can be partially replaced or combined.

First Embodiment

Figure 2A:
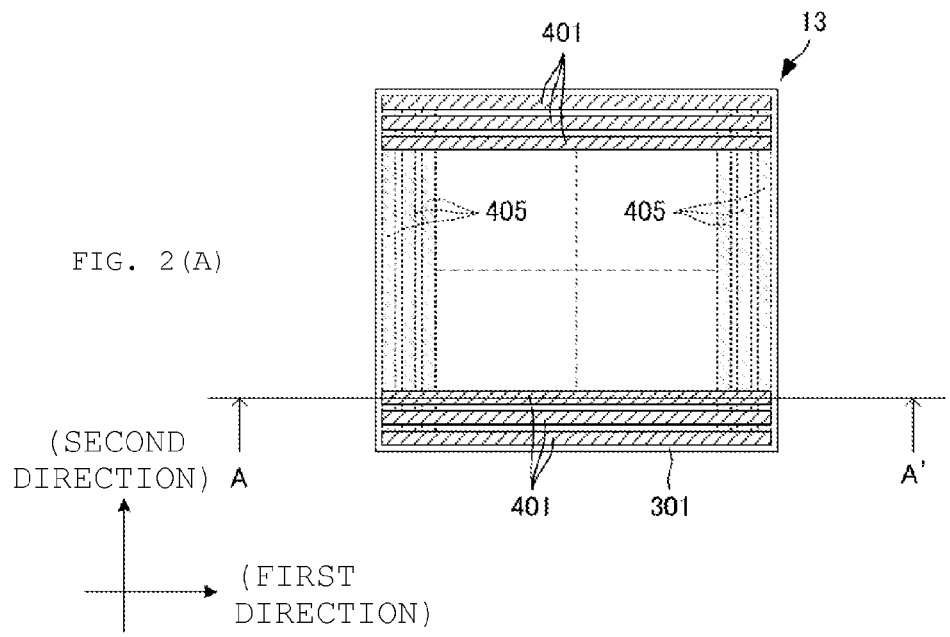
FIG. 2(A) is a plan view illustrating a structure of a capacitive sensor 13 of the panel 21A.
Figure 2B:
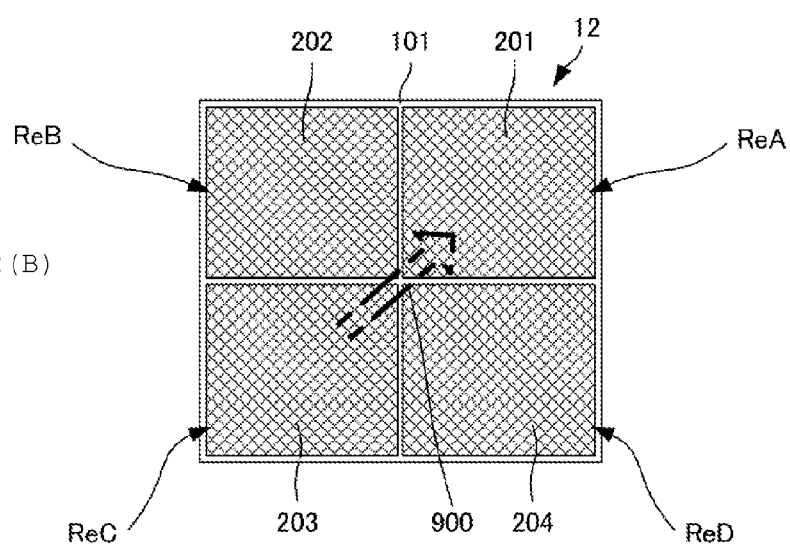
FIG. 2(B) is a plan view illustrating a structure of a piezoelectric sensor 12 of the panel 21A.
Figure 2C:
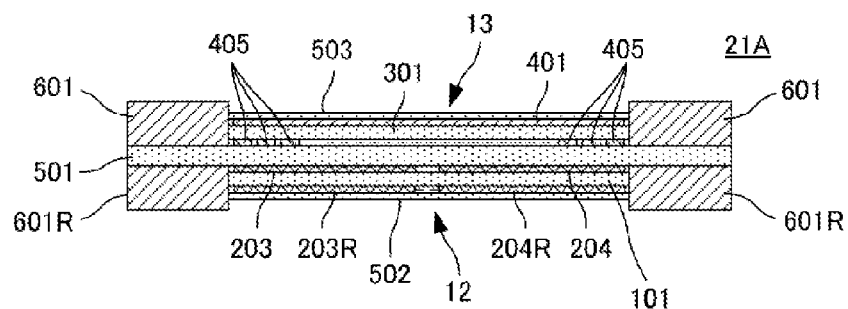
FIG. 2(C) is an A-A' sectional view in FIGS. 1 and 2(A).
Figure 3:
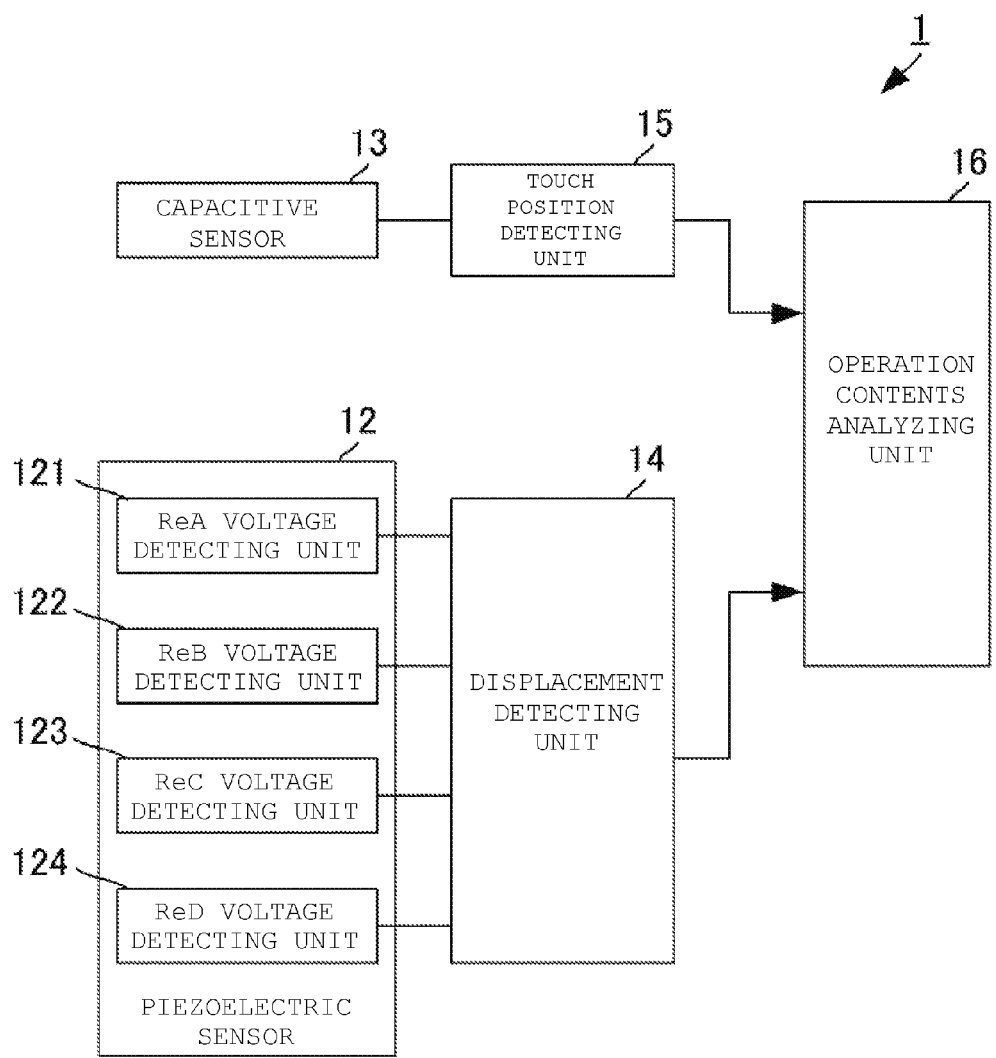
FIG. 3 is a functional block diagram of the input terminal 1 according to the first embodiment of the present invention.

An input terminal according to the first embodiment of the present invention will be described with reference to the drawings. FIG. 1 is a plan view of a panel 21A of an input terminal 1 according to the first embodiment of the present invention. FIGS. 2(A) to 2(C) are views explaining a structure of the panel 21A of the input terminal 1 according to the first embodiment of the present invention. FIG. 2(A) is a plan view illustrating a structure of a capacitive sensor 13 of the panel 21A. FIG. 2(B) is a plan view illustrating a structure of a piezoelectric sensor 12 of the panel 21A. FIG. 2(C) is an A-A' sectional view in FIGS. 1 and 2(A). In FIG. 2(C), the thickness of each portion is exaggerated. The same applies to the sectional views of each of subsequent embodiments. FIG. 3 is a functional block diagram of the input terminal 1 according to the first embodiment of the present invention.

The input terminal 1 includes the piezoelectric sensor 12, the capacitive sensor 13, a displacement detecting unit 14, a touch position detecting unit 15 and an operation contents analyzing unit 16. The piezoelectric sensor 12, the capacitive sensor 13, a base substrate 501, rigid bodies 601, and rigid bodies 601R are combined to form the panel 21A, and the panel 21A adopts a structure illustrated in FIG. 2(C).

The piezoelectric sensor 12 includes a piezoelectric film 101, a displacement detection electrode 201, a displacement detection electrode 202, a displacement detection electrode 203, a displacement detection electrode 204, a displacement detection electrode 201R, a displacement detection electrode 202R, a displacement detection electrode 203R, and a displacement detection electrode 204R.

The piezoelectric film 101 is a flat film of a rectangular shape including a third principal surface and a fourth principal surface opposing to each other. In this regard, a longitudinal direction is a first direction, and a lateral direction is a second direction. The piezoelectric film 101 is made of uniaxially stretched poly-L-lactic acid (PLLA). In the present embodiment, the piezoelectric film 101 is uniaxially stretched along a direction which substantially lies along a diagonal line of the rectangular shape (see an outlined arrow of a dashed-two dotted line in FIG. 2(B)). This direction will be referred to as a uniaxial stretching direction 900. When the piezoelectric film 101 is square, the uniaxial stretching direction 900 preferably lies along the diagonal line. Further, when the piezoelectric film 101 is rectangular, the uniaxial stretching direction 900 preferably forms an angle of 45° with respect to the first direction or the second direction. In this regard, the angle is not limited to this, and may be designed as an optimal angle by taking into account characteristics of the piezoelectric film 101 and a use state of a device. Thus, the uniaxial stretching direction 900 is set to form a predetermined angle with respect to the first direction and the second direction of the piezoelectric film 101.

Such PLLA is made of a chiral polymer and has a main chain which adopts a spiral structure. The PLLA has piezoelectricity when the PLLA is uniaxially stretched and molecules are oriented. A piezoelectric constant of the uniaxially stretched PLLA belongs to a group of very high piezoelectric constants among polymers.

In this regard, a stretching ratio is preferably 3 to 8 times. By performing heating treatment after performing stretching, crystallization of extended chain crystal of polylactic acid is accelerated, and the piezoelectric constant improves. In addition, when biaxial stretching is performed, it is possible to provide the same effect as that of uniaxial stretching by employing different stretching ratios for respective axes. When, for example, the film is stretched eight times in a given direction which is an X axis, and the film is stretched twice in a Y axis direction orthogonal to the X axis, it is possible to provide the same effect in terms of the piezoelectric constant as an effect obtained when the film is uniaxially stretched four times in the X axis direction. A simply uniaxially stretched film is likely to break in a stretching axial direction. Consequently, by performing biaxial stretching as described above, it is possible to increase the strength to some degree.

Further, the PLLA exhibits piezoelectricity as a result of molecular orientation treatment by stretching, and does not need to be subjected to poling treatment unlike other polymers such as PVDF or piezoelectric ceramic. That is, the piezoelectricity of the PLLA which does not belong to ferroelectrics is exhibited not by ion polarization as in ferroelectrics such as PVDF or PZT, but derives from a spiral structure which is a characteristic structure of molecules. Hence, the PLLA does not exhibit pyroelectricity produced by other ferroelectric piezoelectric bodies. Further, although PVDF fluctuates in a piezoelectric constant with time and the piezoelectric constant significantly lowers in some cases, a piezoelectric constant of the PLLA is very stable over time.

Furthermore, the PLLA has a high piezoelectric output constant (=piezoelectric g constant, $g=\varepsilon^T$). Consequently, it is possible to detect a displacement with a high sensitivity by using PLLA. The main embodiment will be described by using the PLLA herein. However, PDLA which is an optical isomer of the PLLA may be used.

The displacement detection electrode 201, the displacement detection electrode 202, the displacement detection electrode 203 and the displacement detection electrode 204 are formed on the third principal surface which is one principal surface of the piezoelectric film 101 made of the PLLA having such characteristics. The displacement detection electrode 201, the displacement detection electrode 202, the displacement detection electrode 203 and the displacement detection electrode 204 are formed in shapes which divide the third principal surface of the piezoelectric film 101 nearly equally into four. More specifically, the displacement detection electrode 201 and the displacement detection electrode 202 are formed aligning along the first direction of the piezoelectric film 101. The displacement detection electrode 203 and the displacement detection electrode 204 are formed aligning along the first direction of the piezoelectric film 101. Further, the displacement detection electrode 201 and the displacement detection electrode 203 are formed aligning along the second direction of the piezoelectric film 101. The displacement detection electrode 202 and the displacement detection electrode 204 are formed aligning along the second direction of the piezoelectric film 101.

According to this configuration, the displacement detection electrode 201 and the displacement detection electrode 203 are configured to be disposed on one diagonal line of the piezoelectric film 101. Further, the displacement detection electrode 202 and the displacement detection electrode 204 are configured to be disposed on the other diagonal line of the piezoelectric film 101. The displacement detection electrode 201, the displacement detection electrode 202, the displacement detection electrode 203 and the displacement detection electrode 204 are configured to be disposed rotationally symmetrical at 180° with respect to a center of an operation surface when seen from a plan view.

The displacement detection electrode 201R, the displacement detection electrode 202R, the displacement detection electrode 203R and the displacement detection electrode 204R are formed on the fourth principal surface which is the other principal surface of the piezoelectric film 101. The displacement detection electrode 201R has the substantially same area as that of the displacement detection electrode 201, and is formed at a position at which a nearly entire surface of the displacement detection electrode 201R opposes to the displacement detection electrode 201. The displacement detection electrode 202R has the substantially same area as that of the displacement detection electrode 202, and is formed at a position at which a nearly entire surface of the displacement detection electrode 202R opposes to the displacement detection electrode 202. The displacement detection electrode 203R has the substantially same area as that of the displacement detection electrode 203, and is formed at a position at which a nearly entire surface of the displacement detection electrode 203R opposes to the displacement detection electrode 203. The displacement detection electrode 204R has the substantially same area as that of the displacement detection electrode 204, and is formed at a position at which a nearly entire surface of the displacement detection electrode 204R opposes to the displacement detection electrode 204.

For the displacement detection electrode 201, the displacement detection electrode 202, the displacement detection electrode 203, the displacement detection electrode 204, the displacement detection electrode 201R, the displacement detection electrode 202R, displacement detection electrode 203R and the displacement detection electrode 204R, ones of organic electrodes whose main components are ITO, ZnO and polythiophene, organic electrodes whose main component is polyaniline, electrodes for which silver nanowires are used and electrodes for which carbon nanotubes are used are preferably used. By using these materials, it is possible to form a highly light-transmissive electrode pattern. In addition, it is also possible to use electrodes formed by silver paste or metal electrodes formed by deposition, spattering or plating when transparency is not necessary. The panel 21A is significantly displaced, and therefore electrodes whose main component is polythiophene having good flexibility, organic electrodes whose main component is polyaniline, silver nanowire electrodes, carbon nanotube electrodes or metal electrodes are particularly preferable.

An area of the piezoelectric film 101 sandwiched by the displacement detection electrode 201 and the displacement detection electrode 201R is a detection area ReA which functions as a ReA voltage detecting unit 121. An area of the piezoelectric film 101 sandwiched by the displacement detection electrode 202 and the displacement detection electrode 202R is a detection area ReB which functions as a ReB voltage detecting unit 122. An area of the piezoelectric film 101 sandwiched by the displacement detection electrode 203 and the displacement detection electrode 203R is a detection area ReC which functions as a ReC voltage detecting unit 123. An area of the piezoelectric film 101 sandwiched by the displacement detection electrode 204 and the displacement detection electrode 204R is a detection area ReD which functions as a ReD voltage detecting unit 124.

The piezoelectric sensor 12 employing such a configuration includes a first principal surface and a second principal surface opposing to each other, and is pasted on a second principal surface of the base substrate 501 made of a flat plate of a rectangular shape. That is, as illustrated in FIG. 2(C), the third principal surface of the piezoelectric film 101 of the piezoelectric sensor 12 is disposed facing and parallel to the second principal surface of the base substrate 501. Thus, the piezoelectric sensor 12 is pasted on the base substrate 501. Therefore, when a surface of the base substrate 501 is stretched or contracted in response to a displacement of the base substrate 501, the piezoelectric film 101 is also stretched or contracted in response to this stretch and contract of the surface of the base substrate 501.

The base substrate 501 is made of polymer having a relatively high strength, such as polyethylene terephthalate (PET), polyethylene naphthalate (PEN), polycarbonate (PC) or acrylic resin (PMMA). Further, the base substrate may be made of metal. The thickness of the base substrate 501 is optionally set according to a strength which is necessary for the base substrate 501.

Further, the rigid bodies 601 are disposed on the first principal surface which is one principal surface of the base substrate 501. The rigid bodies 601 are disposed along the second direction at end portions of facing two sides on the first principal surface of the base substrate 501. The rigid bodies 601R are disposed on the second principal surface which is the other principal surface of the base substrate 501. The rigid bodies 601R are disposed along the second direction at end portions of facing two sides on the second principal surface of the base substrate 501. The rigid bodies 601R have the substantially same area as those of the rigid bodies 601, and are disposed at positions at which nearly entire surfaces of the rigid bodies 601R oppose to the rigid bodies 601 across the base substrate 501. The rigid bodies 601 and the rigid bodies 601R are, for example, aluminum (Al) flat plates. A configuration illustrated in FIG. 2(C) adopts a structure that the rigid bodies 601 and the rigid bodies 601R sandwich the end portions of the facing two sides of the base substrate 501 in the first direction from both of the first principal surface and the second principal surface of the base substrate 501.

In this regard, when, as described above, the longitudinal direction of the base substrate 501 which is made of a flat plate of the rectangular shape is the first direction, and the lateral direction is the second direction, the rigid bodies 601 and the rigid bodies 601R are preferably formed at both end portions in the first direction and along the second direction. Although described below in detail, the rigid bodies 601 and the rigid bodies 601R are disposed along the end portions of the base substrate 501 instead of a center portion of the base substrate 501. Consequently, it is easy to secure a voltage necessary to detect a bend displacement and a twist displacement. Further, the rigid bodies 601 and the rigid bodies 601R are disposed along the second direction and thereby are disposed along the end portions of the facing two sides and in parallel. Consequently, it is possible to detect a twist displacement with a high sensitivity similar to a bend displacement.

Materials of the rigid bodies 601 and the rigid bodies 601R are not limited to the configuration according to the present embodiment. The materials can be arbitrarily changed as long as the materials have rigidity which can partially prevent deformation of a twist of the base substrate 501. It is also possible to use, for example, wood, plastic, metal and the like. In this regard, when a material having conductivity is used for the rigid bodies, it is necessary to form a protection film having an insulation property, on rigid body surfaces. A method for attaching the rigid bodies to the base substrate is not limited to the configuration according to the present embodiment, and can be arbitrarily changed to a pasting method using an adhesive, a screwing method using screws or a combination of the above methods. Further, metal formed by deposition, spattering or plating can also be used as long as the metal has rigidity which can partially prevent deformation of a twist of the base substrate 501.

The capacitive sensor 13 includes a base film 301, a plurality of segment electrodes 401 and a plurality of common electrodes 405. The base film 301 is a flat film of a rectangular shape including a fifth principal surface and a sixth principal surface opposing to each other. The base film 301 is made of a material having a predetermined dielectric constant, and has a strength which does not inhibit a displacement (a bend, a twist or the like) of the base substrate 501 as much as possible. The base film 301 is preferably made of a material having light-transmissiveness.

A plurality of segment electrodes 401 is formed aligning at predetermined intervals on the fifth principal surface which is one principal surface of the base film 301. Each of the plurality of segment electrodes 401 is formed in an elongated shape, and is aligned along a direction orthogonal to an elongation direction.

A plurality of common electrodes 405 is formed aligning at predetermined intervals on the sixth principal surface which is the other principal surface of the base film 301. Each of the plurality of common electrodes 405 is formed in an elongated shape, and is aligned along a direction orthogonal to an elongation direction. The plurality of segment electrodes 401 and the plurality of common electrodes 405 are formed such that, when seen from a direction orthogonal to the fifth principal surface and the sixth principal surface, the elongation direction of the plurality of common electrodes 405 and the elongation direction of the plurality of segment electrodes 401 are nearly orthogonal.

In addition, the segment electrodes 401 and the common electrodes 405 need to be formed by using the same material as that of the above displacement detection electrode 201, displacement detection electrode 202, displacement detection electrode 203, displacement detection electrode 204, displacement detection electrode 201R, displacement detection electrode 202R, displacement detection electrode 203R and displacement detection electrode 204R.

According to this configuration, it is possible to configure a capacitive touch position detection panel which detects a touch position by detecting a change in a capacitance between the segment electrodes 401 and the common electrodes 405 and corresponding to a position of a touch.

The capacitive sensor 13 employing this configuration is pasted on the first principal surface which is one principal surface of the base substrate 501. That is, the capacitive sensor 13 is pasted on a surface opposing to the surface of the base substrate 501 on which the piezoelectric sensor 12 is pasted.

A protection film 503 is disposed on the surface at a side opposite to a surface of the capacitive sensor 13 pasted on the base substrate 501. The protection film 503 is made of a material having flexibility and having an insulation property. The protection film 503 is made of a material having light-transmissiveness. For example, PET or PP needs to be used for the protection film 503.

A protection film 502 is disposed on a surface at a side opposite to a surface of the piezoelectric sensor 12 pasted on the base substrate 501. The protection film 502 is made of a material having flexibility and having an insulation property. The protection film 502 is made of a material having light-transmissiveness. For example, PET or PP needs to be used for the protection film 502.

According to the above configuration, the panel 21A including the piezoelectric sensor 12, the capacitive sensor 13, the base substrate 501, the rigid bodies 601 and the rigid bodies 601R can be formed in a flat shape, i.e., a thin shape. Further, the panel 21A having light-transmissiveness can be configured by making the base substrate 501, the piezoelectric sensor 12, the capacitive sensor 13, the protection film 502 and the protection film 503 of the material having light-transmissiveness. Thus, the panel 21A has the light-transmissiveness, so that, when a liquid crystal display or the like is disposed on a back surface side of the panel 21A, it is possible to view an indication on the liquid crystal display. Further, it is also possible to dispose photocells at the back surface of the panel 21A. By disposing the photocells in this way, it is possible to charge electricity generated by the photocells to a secondary cell which is additionally installed to use for a power supply of the input terminal 1.

(Function Provided by Disposing Rigid Bodies)

Figure 4A:
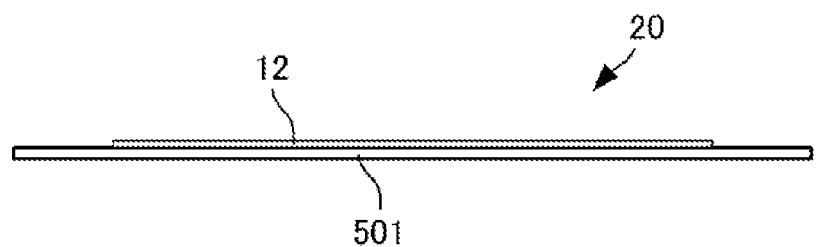
FIG. 4(A) is a side view illustrating a state where the panel 20 which does not include a rigid body is not yet bent.
Figure 4B:
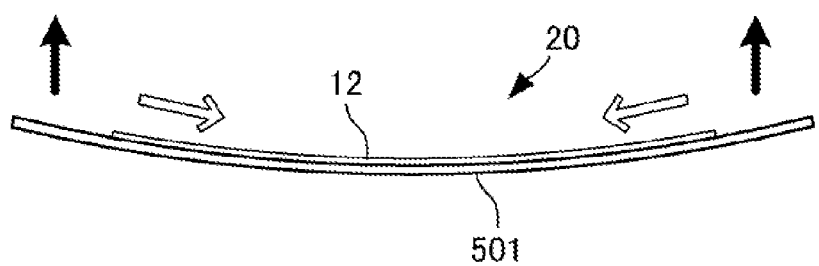
FIG. 4(B) is a side view illustrating that the panel 20 is bent.
Figure 4C:
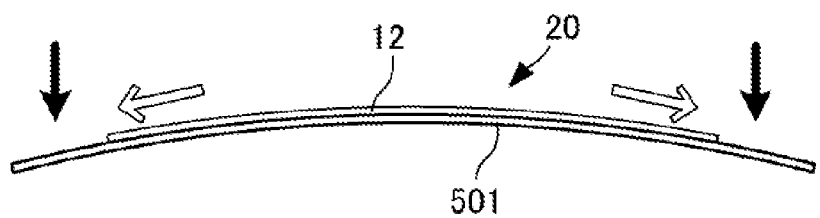
FIG. 4(C) is a side view illustrating that the panel 20 is bent in a direction opposite to FIG. 4(B).
Figure 6A:
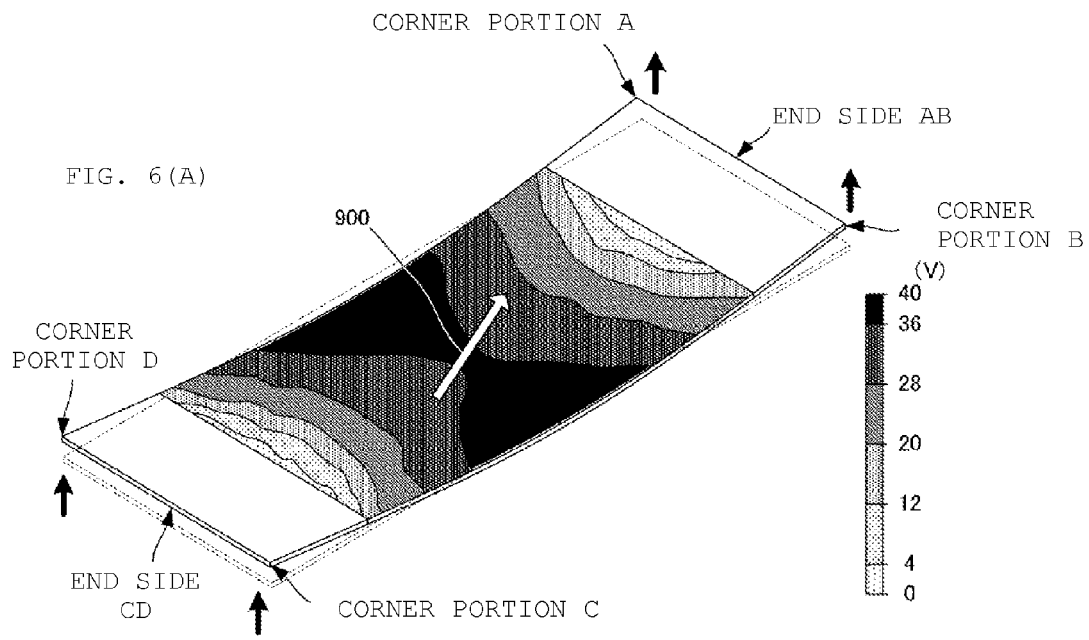
FIG. 6(A) is a view illustrating a voltage distribution produced in a state where the panel 20 which does not include the rigid body is bent.
Figure 6B:
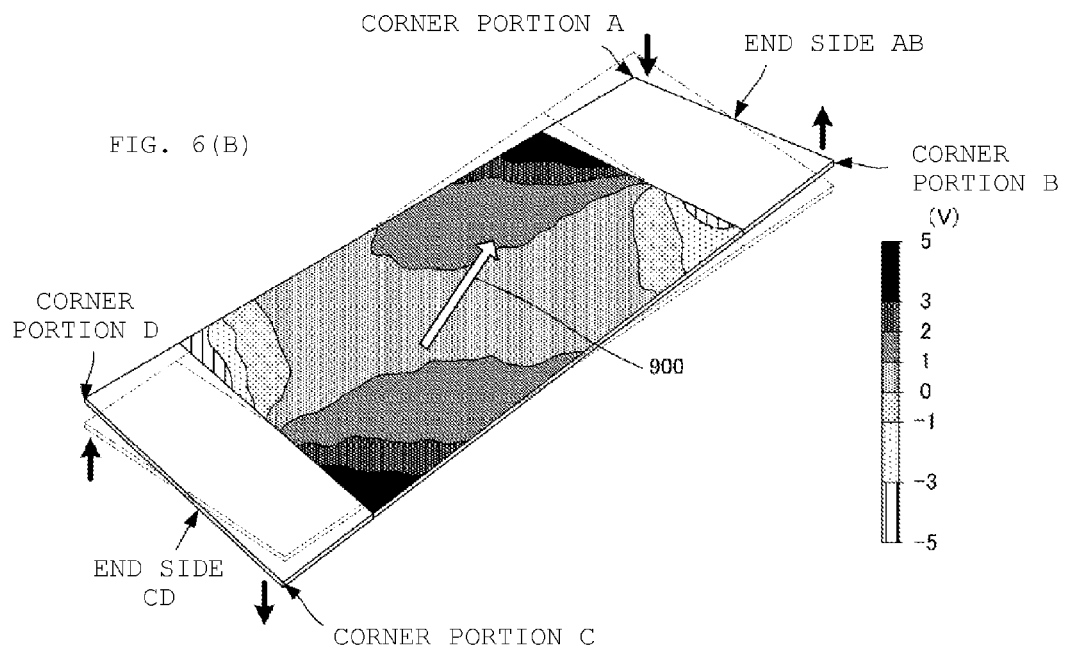
FIG. 6(B) is a view illustrating a voltage distribution produced in a state where the panel 20 which does not include the rigid body is twisted.
Figure 7:
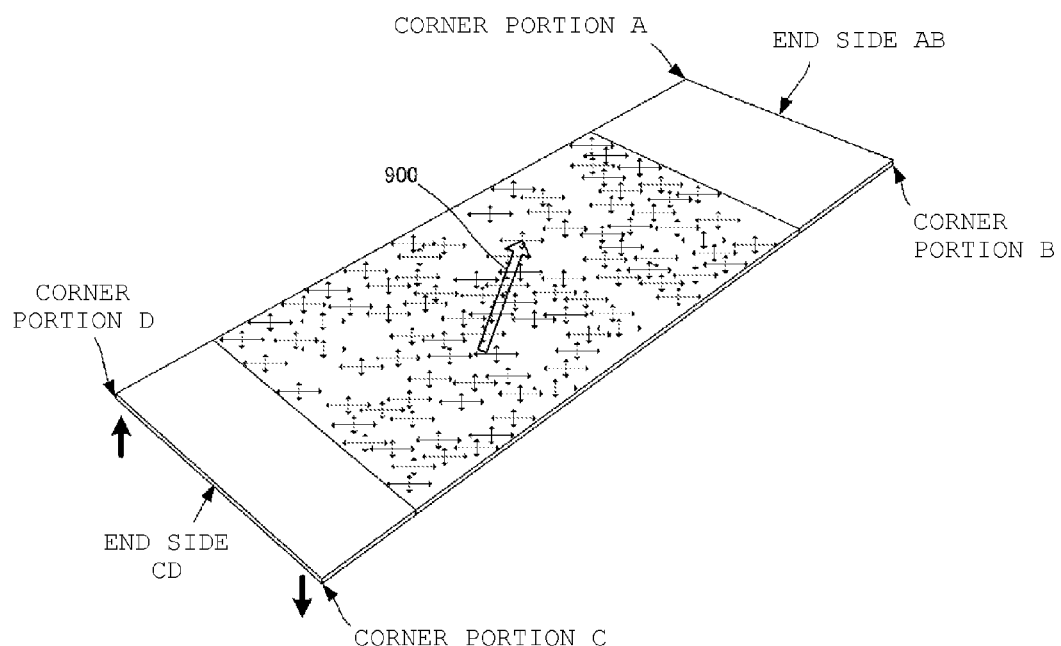
FIG. 7 is a view illustrating a stretching and contracting direction of a piezoelectric film in the state where the panel 20 which does not include the rigid body is twisted.

FIG. 4(A) is a side view illustrating a state where a panel 20 which does not include a rigid body is not yet bent. FIG. 4(B) is a side view illustrating that the panel 20 is bent. FIG. 4(C) is a side view illustrating that the panel 20 is bent in a direction opposite to FIG. 4(B). FIG. 5(A) is a perspective view illustrating a state where the panel 20 which does not include the rigid body is twisted. FIG. 5(B) is a side view illustrating a state where the panel 20 which does not include the rigid body is twisted. FIG. 6(A) is a view illustrating a voltage distribution produced in a state where the panel 20 which does not include the rigid body is bent. FIG. 6(B) is a view illustrating a voltage distribution produced in a state where the panel 20 which does not include the rigid body is twisted. FIG. 7 is a view illustrating a stretching and contracting direction of the piezoelectric film in the state where the panel 20 which does not include the rigid body is twisted. FIGS. 4(A) to 4(C), 5(A), 5(B), 6(A), 6(B), and 7 illustrate a configuration where the piezoelectric sensor 12 is pasted at the upper side in the drawings, and illustrate a simplified structure of the panel 20 for ease of understanding of the drawings and a principal. In FIGS. 6(A) and 6(B), the voltage distribution is expressed by way of shading, and a produced voltage increases as a color changes from a light color to a dark color.

FIG. 4(B) illustrates a state where the panel 20 is bent along the longitudinal direction. FIG. 6(A) illustrates that a corner portion A and a corner portion B which are both ends of an end side AB, and a corner portion C and a corner portion D which are both ends of an end side CD are displaced in a direction nearly orthogonal to the surface of the panel 20 on which the piezoelectric sensor 12 is pasted and in the same direction (see arrows in FIGS. 4(B) and 6(A)). As illustrated in FIG. 4(B), the base substrate 501 of the panel 20 is curved in a valley-folding shape along the longitudinal direction of the base substrate 501. Therefore, the surface of the base substrate 501 is contracted in response to a bend displacement of the base substrate 501. The piezoelectric sensor 12 is pasted on the base substrate 501, and therefore the piezoelectric film of the piezoelectric sensor 12 is contracted in response to the contraction of the surface of the base substrate 501 (see the outlined arrows in FIG. 4(B)).

Thus, when an external force for causing a bend is applied to the panel 20, the voltage distribution illustrated in FIG. 6(A) is produced according to a relationship between the uniaxial stretching direction 900 and a bend direction. That is, the highest voltage is produced at a portion at which the piezoelectric film is stretched the most and which lies along a vertical direction (lateral direction) from the center of the panel 20 in the longitudinal direction, and the voltage to be produced lowers toward the both ends (the end side AB and the end side CD) in the longitudinal direction.

FIG. 5(A) illustrates that the end side AB which is one end of the panel 20 in the longitudinal direction and the end side CD which is the other end are twisted. In other words, FIG. 5(A) illustrates that the corner portion A and the corner portion B which are the both ends of the end side AB, and the corner portion C and the corner portion D which are the both ends of the end side CD are displaced in a direction nearly orthogonal to the surface of the panel 20 on which the piezoelectric sensor 12 is pasted and in opposite directions (see arrows in FIG. 5(A)). As illustrated in FIG. 5(A), the base substrate 501 of the panel 20 is twisted mainly in the substantially same (0°) direction as the uniaxial stretching direction 900 of the piezoelectric film of the piezoelectric sensor 12 or in a vertical (90°) direction to the uniaxial stretching direction 900 (outlined arrows in FIG. 9(B)).

Further, when an external force for causing a twist is applied to the panel 20 as illustrated in FIG. 5(B), the base substrate 501 of the panel 20 is hardly curved in the longitudinal direction, and the piezoelectric film of the piezoelectric sensor 12 pasted on the base substrate 501 is hardly stretched or contracted in a 45° direction with respect to the uniaxial stretching direction 900. Hence, when an external force for causing a twist is applied to the panel 20, the voltage distribution illustrated in FIG. 6(B) is produced according to a relationship between the uniaxial stretching direction 900 and a twist direction. That is, the highest voltages are produced at the corner portion A and the corner portion C at which the piezoelectric film is contracted the most. Voltages of the highest absolute values are produced at the corner portion B and the corner portion D at which the piezoelectric film is stretched the most. In this regard, the voltages produced at the corner portion A and the corner portion C have the substantially same absolute values as those of the voltages produced at the corner portion B and the corner portion D, and voltages of different signs are produced. Further, absolute values of voltages to be produced lower toward the center portion of the piezoelectric film. However, an absolute value of a voltage produced when an external force for causing a twist is applied to the panel 20 is significantly smaller than an absolute value of a voltage produced when an external force for causing a bend is applied to the panel 20.

FIG. 7 is a view illustrating the stretching and contracting direction of the piezoelectric film in the state where the panel 20 is twisted. As illustrated in FIG. 7, the stretching and contracting direction of the piezoelectric film when the panel 20 is twisted is an approximately 0° direction or an approximately 90° direction with respect to the uniaxial stretching direction 900 of the entire piezoelectric film. Further, as illustrated in FIG. 5(B), the piezoelectric film is hardly stretched or contracted in the 45° direction (the longitudinal direction of the base substrate 501) with respect to the uniaxial stretching direction 900 of the piezoelectric film. Hence, an absolute value of a voltage produced when an external force for causing a twist is applied to the panel 20 is significantly smaller than an absolute value of a voltage produced when an external force for causing a bend is applied to the panel 20.

Figure 8A:
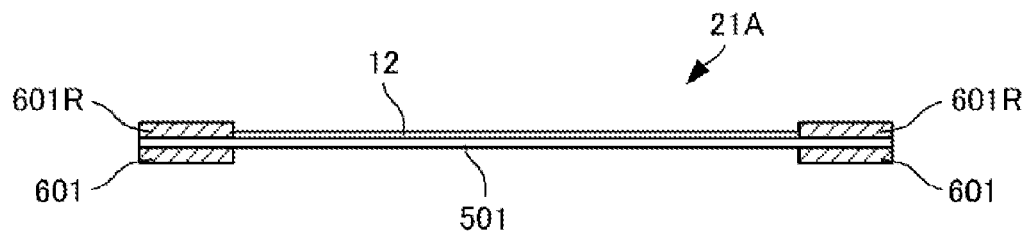
FIG. 8(A) is a side view illustrating a state where the panel 21A is not yet bent.
Figure 8B:
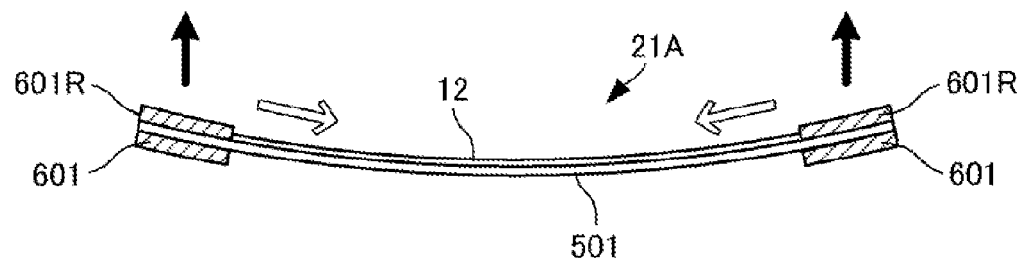
FIG. 8(B) is a side view illustrating that the panel 21A is bent.
Figure 8C:
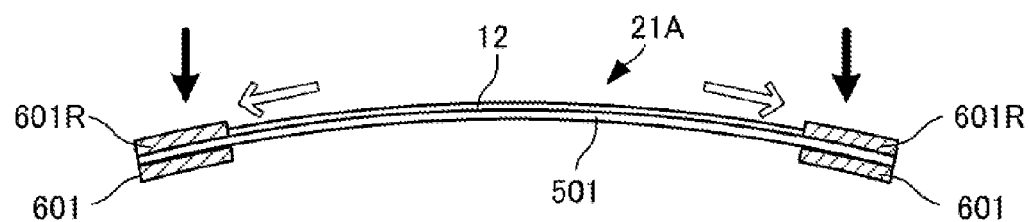
FIG. 8(C) is a side view illustrating that the panel 21A is bent in a direction opposite to FIG. 8(B).
Figure 9A:
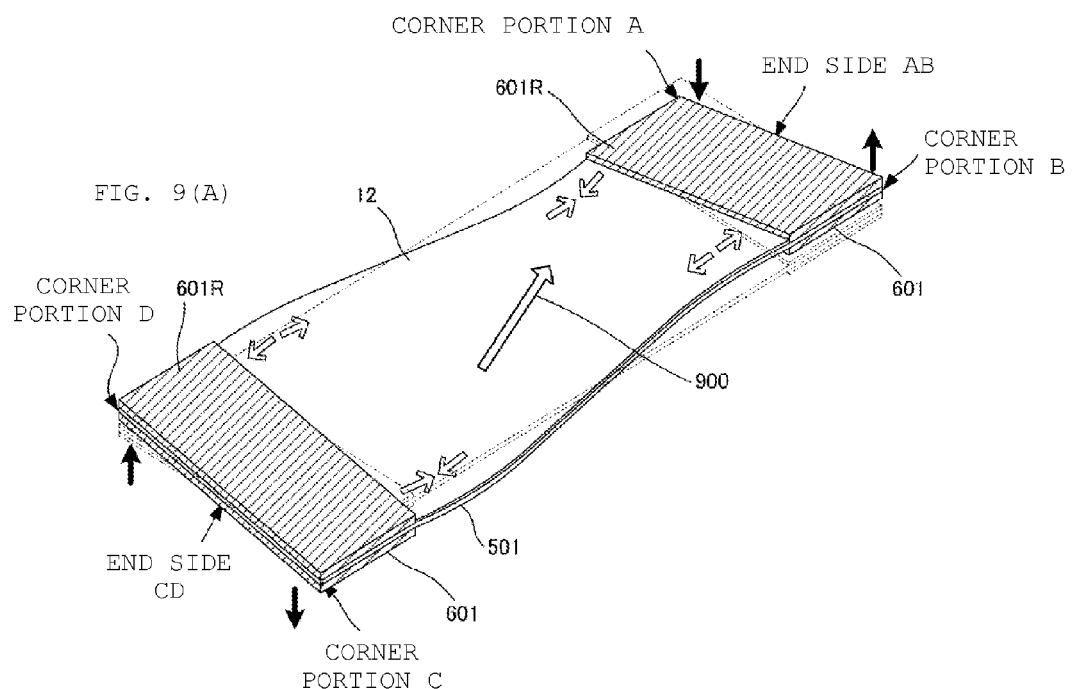
FIG. 9(A) is a perspective view illustrating a state where the panel 21A is twisted.
Figure 9B:
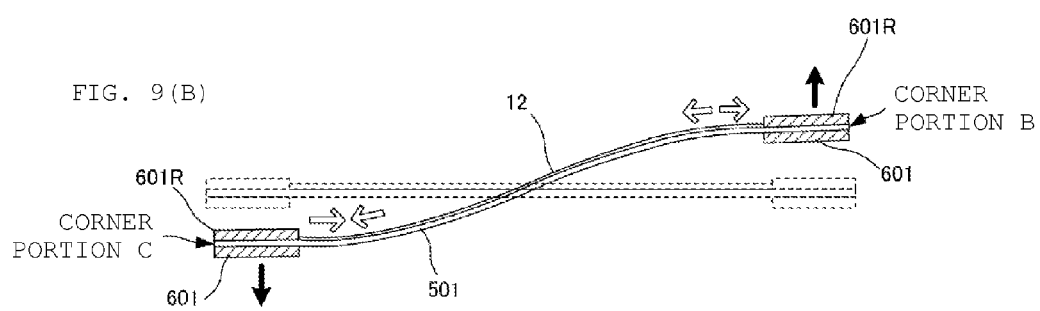
FIG. 9(B) is a side view illustrating a state where the panel 21A is twisted.
Figure 10:
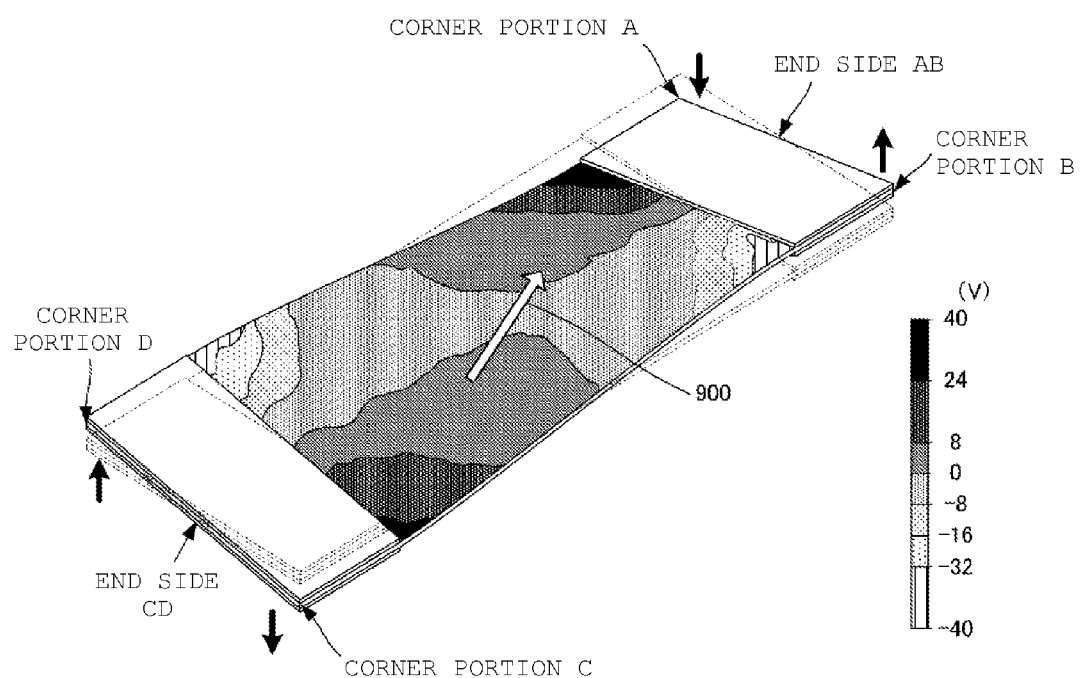
FIG. 10 is a view illustrating a voltage distribution produced in the state where the panel 21A is twisted.
Figures 11, 12:
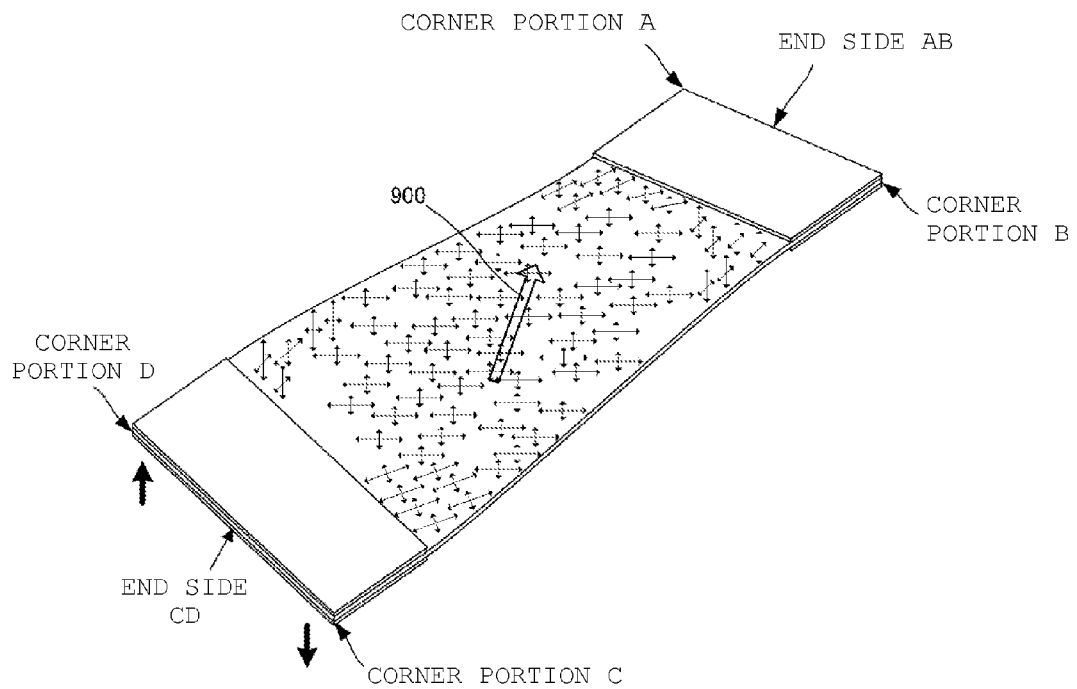
FIG. 11 is a view illustrating the stretching and contracting direction of the piezoelectric film in the state where the panel 21A is twisted.
FIG. 12 is a view illustrating an example of voltage distributions detected by the input terminal 1 in a state where the panel 21A is bent and in a state where the panel 21A is twisted according to the first embodiment.

Next, the panel 21A will be described with reference to the drawings. FIG. 8(A) is a side view illustrating a state where the panel 21A is not yet bent. FIG. 8(B) is a side view illustrating that the panel 21A is bent. FIG. 8(C) is a side view illustrating that the panel 21A is bent in a direction opposite to FIG. 8(B). FIG. 9(A) is a perspective view illustrating a state where the panel 21A is twisted. FIG. 9(B) is a side view illustrating a state where the panel 21A is twisted. FIG. 10 is a view illustrating a voltage distribution produced in the state where the panel 21A is twisted. FIG. 11 is a view illustrating the stretching and contracting direction of the piezoelectric film in the state where the panel 21A is twisted. FIGS. 8(A) to 8(C), 9(A), 9(B), 10 and 11 illustrate a configuration where the piezoelectric sensor 12 is pasted at the upper side in the drawings, and illustrate a simplified structure of the panel 21A for ease of understanding of the drawings and a principal. In FIG. 10, the voltage distribution is expressed by way of shading, and a produced voltage increases as a color changes from a light color to a dark color.

FIG. 8(B) illustrates a state where the panel 21A is bent along the longitudinal direction. FIG. 6(A) illustrates that the corner portion A and the corner portion B which are both ends of the end side AB, and the corner portion C and the corner portion D which are both ends of the end side CD are displaced in a direction nearly orthogonal to the surface of the panel 21A on which the piezoelectric sensor 12 is pasted and in the same direction (see arrows in FIGS. 8(B)). Similar to the panel 20, the base substrate 501 of the panel 21A is curved in a valley-folding shape along the longitudinal direction. Hence, when an external force for causing a bend is applied to the panel 21A, the voltage distribution illustrated in FIG. 6(A) is produced according to a relationship between the uniaxial stretching direction 900 and the bend direction similar to the panel 20.

Similar to FIG. 5(A), FIG. 9(B) illustrates that the end side AB which is one end of the panel 21A in the longitudinal direction and the end side CD which is the other end are twisted. In other words, FIG. 5(A) illustrates that the corner portion A and the corner portion B which are the both ends of the end side AB, and the corner portion C and the corner portion D which are the both ends of the end side CD are displaced in a direction nearly orthogonal to the surface of the panel 21A on which the piezoelectric sensor 12 is pasted and in opposite directions (see arrows in FIG. 9(A)).

When an external force for causing a twist is applied to the panel 21A, the base substrate 501 at a side of the corner portion B of the panel 21A is curved in a mountain-folding shape along the longitudinal direction as illustrated in FIGS. 9(A) and 9(B). Hence, the surface of the base substrate 501 is stretched in response to the displacement of the base substrate 501, and the piezoelectric film of the piezoelectric sensor 12 is also stretched in response to the stretch of the surface of the base substrate 501 (see outlined arrows at the side of the corner portion B in FIGS. 9(A) and 9(B)).

Further, the base substrate 501 at a side of the corner portion C of the panel 21A is curved in a valley-folding shape along the longitudinal direction. Hence, the surface of the base substrate 501 is contracted in response to the displacement of the base substrate 501, and the piezoelectric film of the piezoelectric sensor 12 is also contracted in response to the contraction of the surface of the base substrate 501 (see outlined arrows at the side of the corner portion C in FIGS. 9(A) and 9(B)).

Meanwhile, the base substrate 501 at a side of the corner portion A of the panel 21A is curved in a valley-folding shape along the longitudinal direction. Hence, the surface of the base substrate 501 is contracted in response to the displacement of the base substrate 501, and the piezoelectric film of the piezoelectric sensor 12 is also contracted in response to the contraction of the surface of the base substrate 501 (see outlined arrows at the side of the corner portion A in FIG. 9(A)). Further, the base substrate 501 at a side of the corner portion D of the panel 21A is curved in a valley-folding shape along the longitudinal direction. Hence, the surface of the base substrate 501 is contracted in response to the displacement of the base substrate 501, and the piezoelectric film of the piezoelectric sensor 12 is also contracted in response to the contraction of the surface of the base substrate 501 (see outlined arrows at the side of the corner portion D in FIG. 9(A)).

Hence, when an external force for causing a twist is applied to the panel 21A, the voltage distribution illustrated in FIG. 10 is produced according to a relationship between the uniaxial stretching direction 900 and a twist direction. Voltages of the highest absolute value are produced at the corner portion A and the corner portion C at which the piezoelectric film is contracted the most. Voltages of the highest absolute values are produced at the corner portion B and the corner portion D at which the piezoelectric film is stretched the most. In this regard, the voltages produced at the corner portion A and the corner portion C have the substantially same absolute values as those of the voltages produced at the corner portion B and the corner portion D, and voltages of different signs are produced. Further, absolute values of voltages to be produced lower toward the center portion of the piezoelectric film.

That is, this is the same as that of the panel 20 illustrated in FIG. 6(B). In this regard, the voltage produced at each corner portion in the state where the panel 21A is twisted is higher than a voltage produced at each corner portion in the state where the panel 20 is twisted, and has the substantially same absolute value as that of the voltage produced in the state where the panel is bent. This reason will be described below.

FIG. 11 illustrates the stretching and contracting direction of the piezoelectric film in the state where the panel 21A is twisted. As illustrated in FIG. 11, when the panel 21A is twisted, the stretching and contracting direction of the piezoelectric film is the approximately 0° direction or the approximately 90° direction with respect to the uniaxial stretching direction 900 at a center portion of the panel 21A yet is the approximately 45° direction with respect to the uniaxial stretching direction 900 near the rigid bodies. This is because, when the rigid bodies are disposed along the end portions of the base substrate 501 and the panel 21A is twisted, the surface of the base substrate 501 is partially prevented from stretching and contracting near the rigid bodies, and an orientation of the stretching and contracting direction of the piezoelectric film is partially changed.

That is, the rigid bodies are disposed at the both end portions of the base substrate 501 in the longitudinal direction. Therefore, when the panel 21A is twisted, the orientation of the stretching and contracting direction near the rigid bodies of the surface of the base substrate 501 (and the piezoelectric film) is the same direction as the stretching and contracting direction caused when the panel 21A is bent. Consequently, even when the panel is twisted, it is possible to produce a voltage of the substantially same absolute value as that obtained when the panel is bent.

As described above, according to this configuration, it is possible to obtain a high output of a voltage produced by a twist displacement which is significantly low output in comparison with a voltage produced by a bend displacement. It is possible to detect the twist displacement with a high sensitivity similar to the bend displacement and, consequently, lower a probability that noise or the like is erroneously detected. Further, one piezoelectric film can detect both of the bend displacement and the twist displacement, so that it is not necessary to overlay two piezoelectric films for a bend displacement and a twist displacement. Consequently, it is possible to realize a thin panel and an input terminal without increasing the film thickness in a laminating direction.

The piezoelectric sensor 12 and the capacitive sensor 13 of the panel 21A employing the above configuration are connected to each subsequent circuit as illustrated in FIG. 3.

As illustrated in FIG. 3, a detected voltage V (ReA) outputted from the ReA voltage detecting unit 121, i.e., a voltage produced between the displacement detection electrode 201 and the displacement detection electrode 201R in response to a displacement of the piezoelectric film 101 is outputted to the displacement detecting unit 14. A detected voltage V (ReB) outputted from the ReB voltage detecting unit 122, i.e., a voltage produced between the displacement detection electrode 202 and the displacement detection electrode 202R in response to a displacement of the piezoelectric film 101 is outputted to the displacement detecting unit 14. A detected voltage V (ReC) outputted from the ReC voltage detecting unit 123, i.e., a voltage produced between the displacement detection electrode 203 and the displacement detection electrode 203R in response to a displacement of the piezoelectric film 101 is outputted to the displacement detecting unit 14. A detected voltage V (ReD) outputted from the ReD voltage detecting unit 124, i.e., a voltage produced between the displacement detection electrode 204 and the displacement detection electrode 204R in response to a displacement of the piezoelectric film 101 is outputted to the displacement detecting unit 14.

Although described in detail below, the detected voltage V (ReA), the detected voltage V (ReB), the detected the voltage V (ReC) and the detected voltage V (ReD) are provided in a voltage distribution corresponding to a displacement state of the piezoelectric film 101. Hence, the displacement detecting unit 14 detects a displacement state based on the voltage distribution of the detected voltage V (ReA), the detected voltage V (ReB), the detected the voltage V (ReC) and the detected voltage V (ReD). The displacement detecting unit 14 outputs a displacement state detection result to the operation contents analyzing unit 16.

Each segment electrode 401 and each common electrode 405 of the capacitive sensor 13 are connected to the touch position detecting unit 15. A touch position detection voltage detected by the capacitive sensor 13 is outputted to the touch position detecting unit 15. The touch position detecting unit 15 detects a touch position on the operation surface based on a combination of each segment electrode 401 and each common electrode 405 from which the touch position detection voltage is detected. The touch position detecting unit 15 outputs a touch position detection result to the operation contents analyzing unit 16.

The operation contents analyzing unit 16 analyzes operation contents by using at least one of the displacement state detection result and the touch position detection result.

When analyzing an operation based on the touch position, for example, the operation contents analyzing unit 16 obtains a control command based on the position of the touch from the touch position detection result, and executes the control command.

The control command includes following various commands when the input terminal 1 is used as a TV remote controller.

A command for switching to a channel corresponding to a touch position

A command for adjusting a volume according to a trajectory of a touch position

A command for analyzing a channel number according to a trajectory of a touch position and switching to the analyzed channel When analyzing operation contents based on the displacement state, for example, the operation contents analyzing unit 16 specifies a control command from the displacement state detection result, and executes the control command.

The control command includes following various commands when the input terminal 1 is used as a TV remote controller.

A command for adjusting a volume according to a bend amount and a bend direction when a bend of the input terminal 1 is detected A command for switching a channel according to a twist amount and a twist direction when a twist of the input terminal 1 is detected As described above, by using the configuration according to the present embodiment, it is possible to perform processing of executing the control commands by not only a touch operation on the operation surface but also displacing (bending, twisting or the like) the panel 21A. Consequently, it is possible to realize the input terminal which enables diverse operation inputs.

(Bend and Twist Detection Concept)

Next, a bend and twist detection concept according to the present embodiment will be described in more detail. FIG. 12 is a view illustrating an example of voltage distributions detected by the input terminal 1 in the state where the panel 21A is bent and in the state where the panel 21A is twisted according to the first embodiment of the present invention.

(Bend Displacement Detection)

As illustrated in FIG. 8(A), when a bend displacement is 0, i.e., when an external force for causing a bend is not applied to the panel 21A, the principal surfaces of the base substrate 501 of the panel 21A are flat as illustrated in FIG. 8(A). In this case, the piezoelectric film of the piezoelectric sensor 12 pasted on the second principal surface of the base substrate 501 is not stretched or contracted, and there is not any change in output voltage from the piezoelectric sensor 12 that would be caused by a bend displacement. By, for example, setting detected voltages to 0 [V] in this state, all of the detected voltage V (ReA) outputted from the ReA voltage detecting unit 121, the detected voltage V (ReB) outputted from the ReB voltage detecting unit 122, the detected voltage V (ReC) outputted from the ReC voltage detecting unit 123 and the detected voltage V (ReD) outputted from the ReD voltage detecting unit 124 are 0 [V].

When the bend displacement takes a predetermined value, i.e., when the external force for causing a bend is applied to the panel 21A, the principal surfaces of the base substrate 501 of the panel 21A are curved along the longitudinal direction as illustrated in FIG. 8(B) or 8(C). In this case, the piezoelectric film of the piezoelectric sensor 12 pasted on the second principal surface of the base substrate 501 is stretched or contracted in response to a stretch or a contraction of the surface of the base substrate 501 on which the piezoelectric sensor 12 is pasted. Thus, the bend displacement changes an output voltage from the piezoelectric sensor.

Further, by using the configuration according to the present embodiment, the detected voltage V (ReA), the detected voltage V (ReB), the detected voltage V (ReC) and the detected voltage V (ReD) change as follows.

When the bend displacement is +a, the base substrate 501 is curved in a valley-folding shape along the longitudinal direction as illustrated in FIG. 8(B). Therefore, the surface of the base substrate 501 is contracted in response to the displacement of the base substrate 501, and the piezoelectric film 101 is also contracted in response to the contraction of the surface of the base substrate 501 (see outlined arrows in FIG. 8(B)). Hence, according to a relationship between the uniaxial stretching direction 900 and the bend direction (the longitudinal direction of the panel 21A), the detected voltage V (ReA), the detected voltage V (ReB), the detected voltage V (ReC) and the detected voltage V (ReD) take the substantially same voltage value +VBa as illustrated in FIG. 12.

When the bend displacement is +b (≠+a), the detected voltage V (ReA), the detected voltage V (ReB), the detected voltage V (ReC) and the detected voltage V (ReD) take the substantially same voltage value +VBb (≠+VBa) as illustrated in FIG. 12.

When the bend displacement is −a, i.e., when the bend displacement occurs in a direction opposite to +a and has the same bend amount, the base substrate 501 is curved in a mountain-folding shape along the longitudinal direction as illustrated in FIG. 8(C). Therefore, the surface of the base substrate 501 is stretched in response to the displacement of the base substrate 501, and the piezoelectric film 101 is also stretched in response to the stretch of the surface of the base substrate 501 (see outlined arrows in FIG. 8(C)). Hence, the detected voltage V (ReA), the detected voltage V (ReB), the detected voltage V (ReC) and the detected voltage V (ReD) take the substantially same voltage value −VBa as illustrated in FIG. 12.

Thus, according to the configuration of the present embodiment, all of the detected voltage V (ReA), the detected voltage V (ReB), the detected voltage V (ReC) and the detected voltage V (ReD) take the substantially same voltage value corresponding to a bend amount as a result of a bend displacement.

Hence, when voltages values of the detected voltage V (ReA), the detected voltage V (ReB), the detected the voltage V (ReC) and the detected voltage V (ReD) are compared and detected as the substantially same voltage values, it is possible to detect that the panel 21A is bent. Further, by measuring a voltage value in this case, it is possible to detect a bend direction and a bend amount.

(Twist Displacement Detection)

When a twist displacement is 0, i.e., when an external force for causing a twist is not applied to the panel 21A, the principal surfaces of the base substrate 501 of the panel 21A are flat. In this case, the piezoelectric film 101 of the piezoelectric sensor 12 is not stretched or contracted, and there is not any change in output voltage from the piezoelectric sensor 12 that would be caused by a twist displacement. By, for example, setting detected voltages to 0 [V] in this state, all of the detected voltage V (ReA) outputted from the ReA voltage detecting unit 121, the detected voltage V (ReB) outputted from the ReB voltage detecting unit 122, the detected voltage V (ReC) outputted from the ReC voltage detecting unit 123 and the detected voltage V (ReD) outputted from the ReD voltage detecting unit 124 are 0 [V]

When the twist displacement takes a predetermined value, i.e., when the external force for causing a twist is applied to the panel 21A, the end side AB which is one end of the panel 21A in the longitudinal direction and the end side CD which is the other end in the base substrate 501 of the panel 21A are twisted as illustrated in FIG. 9(A). In other words, the corner portion A and the corner portion B which are the both ends of the end side AB, and the corner portion C and the corner portion D which are the both ends of the end side CD are displaced in the direction nearly orthogonal to the surface of the panel 21A on which the piezoelectric sensor 12 is pasted and in opposite directions (see the arrows in FIG. 9(A)). In this case, the piezoelectric film of the piezoelectric sensor 12 pasted on the second principal surface of the base substrate 501 is stretched or contracted in response to a stretch or a contraction of the surface of the base substrate 501 on which the piezoelectric sensor 12 is pasted. Thus, the twist displacement changes an output voltage from the piezoelectric sensor. More specifically, the twist state individually changes the detected voltage V (ReA), the detected voltage V (ReB), the detected the voltage V (ReC) and the detected voltage V (Re⊃).

When the twist displacement is +c, the corner portion B is displaced upward compared to the principal surface (the surface on which the piezoelectric sensor 12 is pasted), and the corner portion C is displaced downward compared to the principal surface (the surface on which the piezoelectric sensor 12 is pasted) as illustrated in FIG. 9(A). The base substrate 501 at the side of the corner portion B is curved in the mountain-folding shape along the longitudinal direction. Hence, the surface of the base substrate 501 is stretched in response to the displacement of the base substrate 501, and the piezoelectric film of the piezoelectric sensor 12 is also stretched in response to the stretch of the surface of the base substrate 501 (see the outlined arrows at the side of the corner portion B in FIGS. 9(A) and 9(B)). Further, the base substrate 501 at the side of the corner portion C is curved in the valley-folding shape along the longitudinal direction. Hence, the surface of the base substrate 501 is contracted in response to the displacement of the base substrate 501, and the piezoelectric film of the piezoelectric sensor 12 is also contracted in response to the contraction of the surface of the base substrate 501 (see the outlined arrows at the side of the corner portion C in FIGS. 9(A) and 9(B)). Meanwhile, the base substrate 501 at the side of the corner portion A is curved in the valley-folding shape along the longitudinal direction. Hence, the surface of the base substrate 501 is contracted in response to the displacement of the base substrate 501, and the piezoelectric film of the piezoelectric sensor 12 is also contracted in response to the contraction of the surface of the base substrate 501 (see the outlined arrows at the side of the corner portion A in FIG. 9(A)). Further, the base substrate 501 at the side of the corner portion D is curved in the mountain-folding shape along the longitudinal direction. Hence, the surface of the base substrate 501 is stretched in response to the displacement of the base substrate 501, and the piezoelectric film of the piezoelectric sensor 12 is also stretched in response to the stretch of the surface of the base substrate 501 (see the outlined arrows at the side of the corner portion D in FIG. 9(A)).

Hence, according to a relationship between the uniaxial stretching direction 900 and the twist direction, absolute values of the detected voltage V (ReA), the detected voltage V (ReB), the detected voltage V (ReC) and the detected voltage V (ReD) take the substantially same voltage value VWc as illustrated in FIG. 12. Further, the detected voltage V (ReA) and the detected voltage V (ReC), and the detected voltage V (ReB) and the detected voltage V (ReD) have different signs. For example, the detected voltage V (ReA) and the detected voltage V (ReC) take voltage values +VWc, and the detected voltage V (ReB) and the detected voltage V (ReD) take voltage values −VWc.

When the twist displacement is +d (≠+c), the absolute values of the detected voltage V (ReA), the detected voltage V (ReB), the detected voltage V (ReC) and the detected voltage V (ReD) take the substantially same voltage value VWd as illustrated in FIG. 12. Further, the detected voltage V (ReA) and the detected voltage V (ReC), and the detected voltage V (ReB) and the detected voltage V (ReD) have different signs. For example, the detected voltage V (ReA) and the detected voltage V (ReC) take voltage values +VWd, and the detected voltage V (ReB) and the detected voltage V (ReD) take voltage values −VWd.

When the twist displacement is −c, i.e., when the twist displacement occurs in a direction opposite to +c, and has the same twist amount, the base substrate 501 at the side of the corner portion B is curved in the valley-folding shape along the longitudinal direction. Hence, the surface of the base substrate 501 is contracted in response to the displacement of the base substrate 501, and the piezoelectric film of the piezoelectric sensor 12 is also contracted in response to the stretch of the surface of the base substrate 501. Further, the base substrate 501 at the side of the corner portion C is curved in the mountain-folding shape along the longitudinal direction. Hence, the surface of the base substrate 501 is stretched in response to the displacement of the base substrate 501, and the piezoelectric film of the piezoelectric sensor 12 is also stretched in response to the stretch of the surface of the base substrate 501. Meanwhile, the base substrate 501 at the side of the corner portion A is curved in the mountain-folding shape along the longitudinal direction. Hence, the surface of the base substrate 501 is stretched in response to the displacement of the base substrate 501, and the piezoelectric film of the piezoelectric sensor 12 is also stretched in response to the stretch of the surface of the base substrate 501 (see the outlined arrows at the side of the corner portion A in FIG. 9(A)). Further, the base substrate 501 at the side of the corner portion D is curved in the valley-folding shape along the longitudinal direction. Hence, the surface of the base substrate 501 is contracted in response to the displacement of the base substrate 501, and the piezoelectric film of the piezoelectric sensor 12 is also contracted in response to the contraction of the surface of the base substrate 501.

Hence, the absolute values of the detected voltage V (ReA), the detected voltage V (ReB), the detected voltage V (ReC) and the detected voltage V (ReD) take the substantially same voltage value VWc as illustrated in FIG. 12. Further, the detected voltage V (ReA) and the detected voltage V (ReC), and the detected voltage V (ReB) and the detected voltage V (ReD) have different signs. In this case, the signs of the detected voltage are inverse to those in case where the twist displacement is +c. More specifically, when the twist displacement is +c, the detected voltage V (ReA) and detected voltage V (ReC) take the voltage values +VWc, and the detected voltage V (ReB) and the detected voltage V (ReD) take the voltage values −VWc. When the twist displacement is −c, the detected voltage V (ReA) and the detected voltage V (ReC) take the voltage values −VWc and the detected voltage V (ReB) and the detected voltage V (ReD) take the voltage values +VWc.

Thus, according to the configuration according to the present embodiment, the detected voltage V (ReA) and the detected voltage V (ReC) detected by the displacement detection electrodes disposed along the uniaxial stretching direction, and the detected voltage V (ReB) and the detected voltage V (ReD) detected by the displacement detection electrodes disposed along a direction orthogonal to the uniaxial stretching direction have the substantially same voltage absolute value corresponding to a twist amount, and have different signs as a result of a twist displacement.

Hence, by observing a voltage distribution of the detected voltage V (ReA), the detected voltage V (ReB), the detected the voltage V (ReC) and the detected voltage V (ReD), it is possible to detect that the panel 21A is twisted. Further, by measuring voltage values in this case, it is possible to detect a twist direction and a twist amount.

In addition, end portions of the rigid bodies 601 and the rigid bodies 601R of the panel 21A of the input terminal 1 according to the present embodiment are configured to be disposed along the end portions of the base substrate 501 (the both end portions in the first direction) (see FIGS. 1 and 2(C)). However, as long as the rigid bodies have rigidity which can partially prevent deformation of a twist of the base substrate 501, the end portions of the rigid bodies 601 and the rigid bodies 601R do not necessarily need to precisely lie along the end portions of the base substrate 501 (the both end portions in the first direction).

Figure 13:
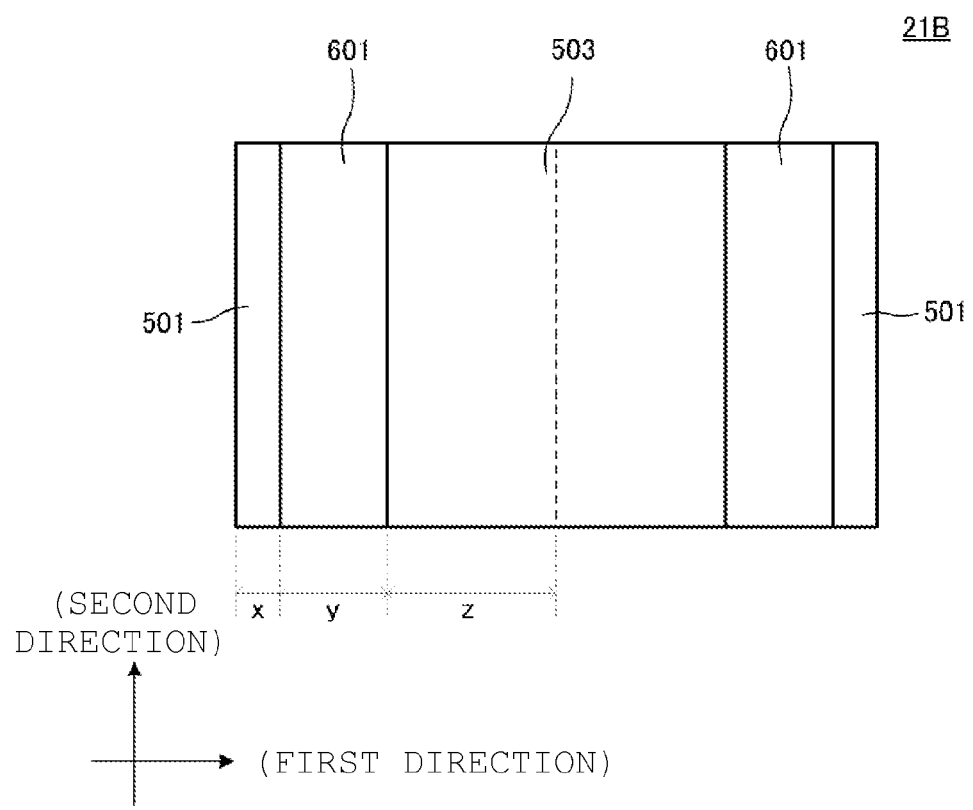
FIG. 13 is a plan view illustrating a structure of a panel 21B of an input terminal according to a modified example.

FIG. 13 is a plan view illustrating a structure of a panel 21B of an input terminal according to a modified example. The panel 21B differs from the panel 21A in an arrangement of the rigid bodies 601 and the rigid bodies 601R, and the other configurations are the same. A distance from one end of the base substrate 501 in the first direction (a left short side of the panel 21B in FIG. 13) to end portions of the rigid bodies is x, the widths of the rigid bodies 601 and the rigid bodies 601R along the first direction are y, and a distance from the end portions of the rigid bodies 601 and the rigid bodies 601R to a virtual parting line which divides the panel 21B equally into two in the second direction is z. In this case, $x<y<z$ holds, so that it is easy to secure voltages necessary to detect a bend displacement and a twist displacement, and the panel 21B can detect the twist displacement with a high sensitivity similar to the bend displacement. Thus, the end portions (the "end portion" in the claims) are not limited to end portions which precisely lie along the end portions of the base substrate 501 (the both end portions in the first direction), and include a case of $x<y$.

Second Embodiment

Next, an input terminal according to the second embodiment will be described with reference to the drawings.

Figure 14:
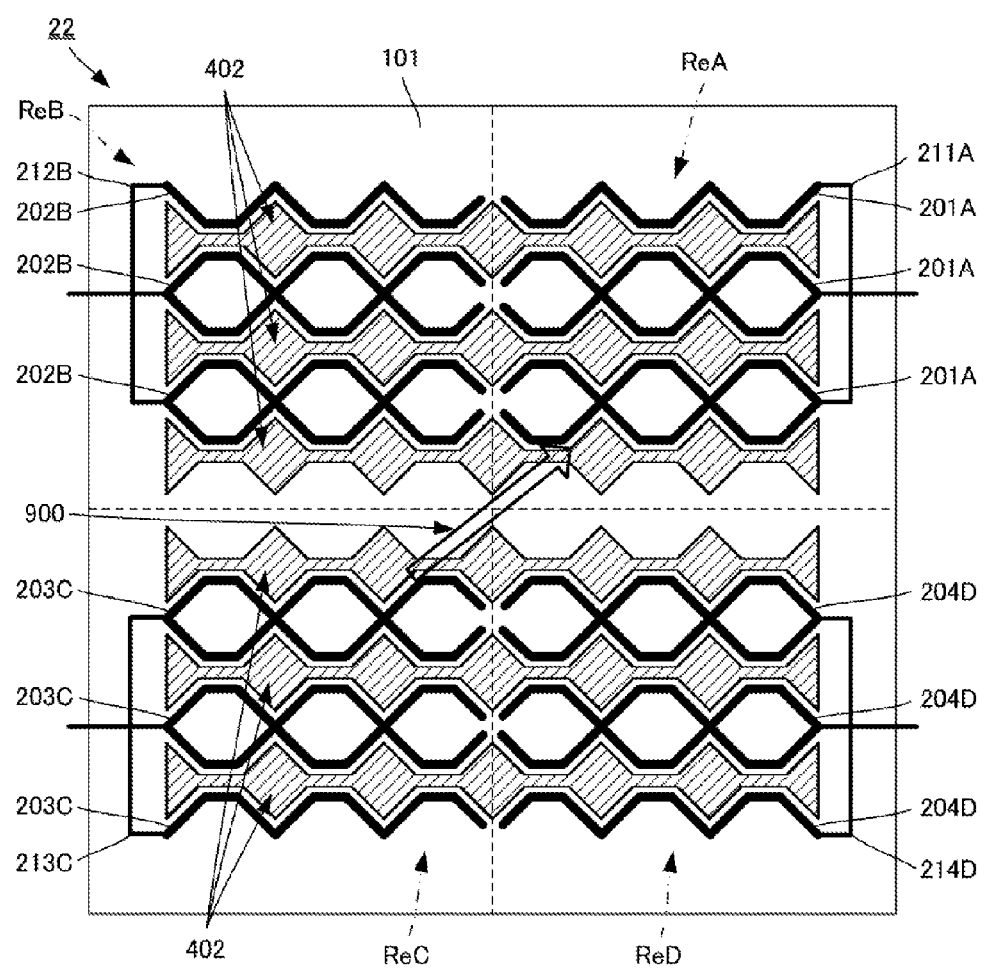
FIG. 14 is a plan view illustrating a structure of a panel 22 of an input terminal according to a second embodiment.
Figure 15:
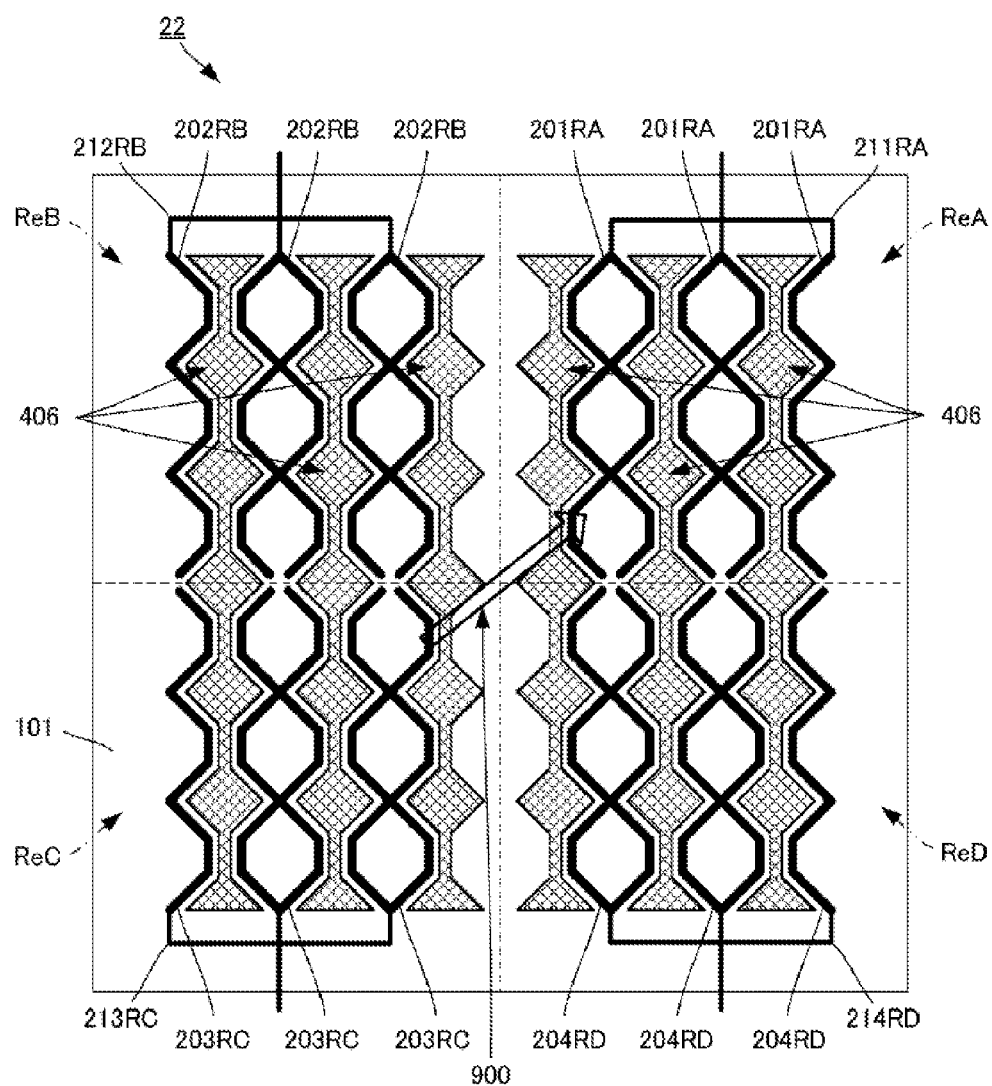
FIG. 15 is a back side view illustrating the structure of the panel 22 of the input terminal according to the second embodiment.

FIG. 14 is a plan view illustrating a structure of a panel 22 of the input terminal according to the second embodiment. FIG. 15 is a back side view illustrating a structure of the panel 22 of the input terminal according to the second embodiment. In this regard, FIGS. 14 and 15 do not illustrate a base substrate and rigid bodies. Schematically, a piezoelectric film 101 of the panel 22 according to the present embodiment functions as a base film of a capacitive sensor.

A plurality of segment electrodes 402 whose schematic shapes are elongated shapes is formed aligning on a third principal surface of the piezoelectric film 101. The plurality of segment electrodes 402 is formed aligning along a direction orthogonal to an elongation direction. Each segment electrode 402 is formed in a shape which alternately connects a wide width portion and a narrow width portion along a longitudinal direction.

A displacement detection electrode 201A, a displacement detection electrode 202B, a displacement detection electrode 203C and a displacement detection electrode 204D are formed on the third principal surface which is one principal surface of the piezoelectric film 101. The displacement detection electrode 201A is formed on a detection area ReA which is divided by a virtual parting line passing a center of the third principal surface when seen from a plan view and orthogonal to each side. The displacement detection electrode 201A is a linear electrode, and is formed in a shape meeting an outer shape of the segment electrode 402 at a predetermined interval apart from the outer shape in a range of the detection area ReA. The displacement detection electrode 201A is connected by a lead-around electrode 211A.

The displacement detection electrode 202B is formed on a detection area ReB which is divided by a virtual parting line passing the center of the third principal surface when seen from the plan view and orthogonal to each side. The displacement detection electrode 202B is a linear electrode, and is formed in a shape meeting an outer shape of the segment electrode 402 at a predetermined interval apart from the outer shape in a range of the detection area ReB. The displacement detection electrode 202B is connected by a lead-around electrode 212B.

The displacement detection electrode 203C is formed on a detection area ReC which is divided by a virtual parting line passing the center of the third principal surface when seen from the plan view and orthogonal to each side. The displacement detection electrode 203C is a linear electrode, and is formed in a shape meeting an outer shape of the segment electrode 402 at a predetermined interval apart from the outer shape in a range of the detection area ReC. The displacement detection electrode 203C is connected by a lead-around electrode 213C.

The displacement detection electrode 204D is formed on a detection area ReD which is divided by a virtual parting line passing the center of the third principal surface when seen from the plan view and orthogonal to each side. The displacement detection electrode 204D is a linear electrode, and is formed in a shape meeting an outer shape of the segment electrode 402 at a predetermined interval apart from the outer shape in a range of the detection area ReD. The displacement detection electrode 204D is connected by a lead-around electrode 214D.

A plurality of common electrodes 406 whose schematic shapes are elongated shapes is formed aligning on a fourth principal surface which is the other principal surface of the piezoelectric film 101. The plurality of common electrodes 406 is formed aligning along a direction orthogonal to the elongation direction. Each common electrode 406 is formed in a shape which alternately connects a wide width portion and a narrow width portion along the elongation direction. The elongation direction of the common electrodes 406 and the elongation direction of the segment electrodes 402 are orthogonal when seen from a direction in which the piezoelectric film 101 is seen from the plan view.

A displacement detection electrode 201RA, a displacement detection electrode 202RB, a displacement detection electrode 203RC and a displacement detection electrode 204RD are formed on the fourth principal surface of the piezoelectric film 101. The displacement detection electrode 201RA is formed on the detection area ReA which is divided by a virtual parting line passing a center of a second principal surface when seen from the plan view and orthogonal to each side. The displacement detection electrode 201RA is a linear electrode, and is formed in a shape meeting an outer shape of the common electrode 406 at a predetermined interval apart from the outer shape in the range of the detection area ReA. The displacement detection electrode 201RA is formed partially overlapping the displacement detection electrode 201A when seen from the direction in which the piezoelectric film 101 is seen from the plan view. The displacement detection electrode 201RA is connected by a lead-around electrode 211RA.

The displacement detection electrode 202RB is formed on the detection area ReB which is divided by a virtual parting line passing the center of the fourth principal surface when seen from the plan view and orthogonal to each side. The displacement detection electrode 202RB is a linear electrode, and is formed in a shape meeting an outer shape of the common electrode 406 at a predetermined interval apart from the outer shape in the range of the detection area ReB. The displacement detection electrode 202RB is formed partially overlapping the displacement detection electrode 202B when seen from the direction in which the piezoelectric film 101 is seen from the plan view. The displacement detection electrode 202RB is connected by a lead-around electrode 212RB.

The displacement detection electrode 203RC is formed on the detection area ReC which is divided by a virtual parting line passing the center of the fourth principal surface when seen from the plan view and orthogonal to each side. The displacement detection electrode 203RC is a linear electrode, and is formed in a shape meeting an outer shape of the common electrode 406 at a predetermined interval apart from the outer shape in the range of the detection area ReC. The displacement detection electrode 203RC is formed partially overlapping the displacement detection electrode 203C when seen from the direction in which the piezoelectric film 101 is seen from the plan view. The displacement detection electrode 203RC is connected by a lead-around electrode 213RC.

The displacement detection electrode 204RD is formed on the detection area ReD which is divided by a virtual parting line passing the center of the fourth principal surface when seen from the plan view and orthogonal to each side. The displacement detection electrode 204RD is a linear electrode, and is formed in a shape meeting an outer shape of the common electrode 406 at a predetermined interval apart from the outer shape in the range of the detection area ReD. The displacement detection electrode 204RD is formed partially overlapping the displacement detection electrode 204D when seen from the direction in which the piezoelectric film 101 is seen from the plan view. The displacement detection electrode 204RD is connected by a lead-around electrode 214RD.

Even according such a configuration, it is possible to enable an operation input based on a touch position and an operation input based on a displacement of the input terminal similar to the above embodiment. Further, by using the configuration according to the present embodiment, one piezoelectric film can form the capacitive sensor and the piezoelectric sensor, so that it is not necessary to individually form the piezoelectric sensor and the capacitive sensor. Consequently, it is possible to form a thinner input terminal. Further, an electrode layer becomes thin in a layer direction, so that transparency increases when the input terminal is made transparent.

In addition, each electrode pattern according to the above embodiment is an exemplary electrode pattern. By forming an electrode pattern by dividing an operation surface into a plurality of areas and enabling detection of a voltage based on a displacement per divided area, it is possible to obtain the above function and effect.

Third Embodiment

Next, an input terminal according to the third embodiment will be described with reference to the drawings.

Figure 16:
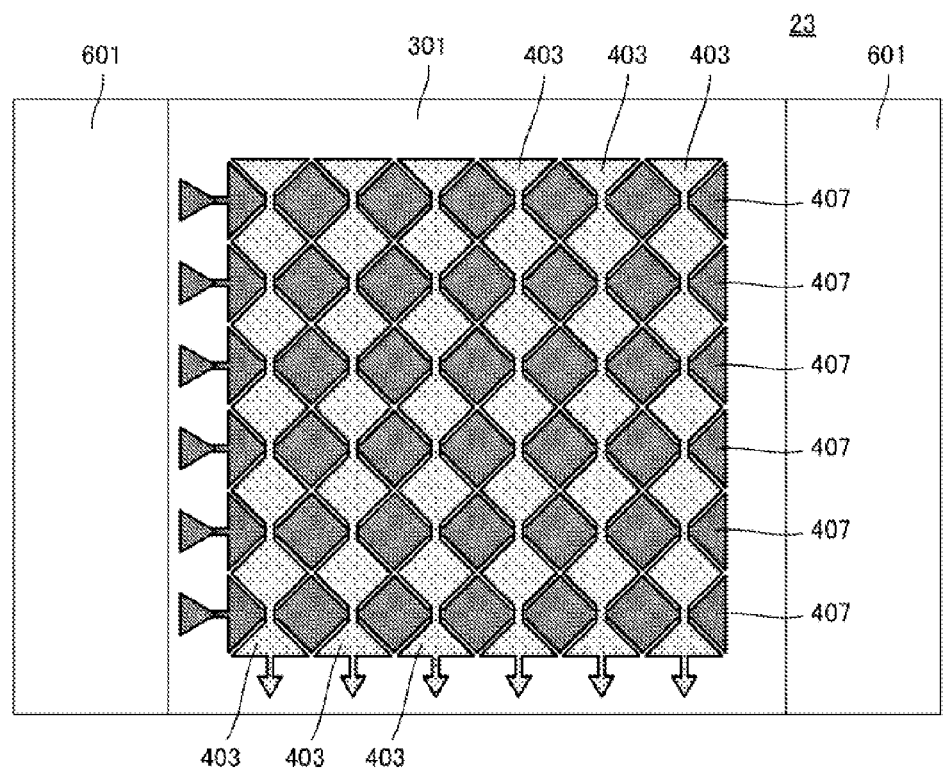
FIG. 16 is a plan perspective view illustrating a structure of a panel 23 of an input terminal according to a third embodiment.
Figure 17:
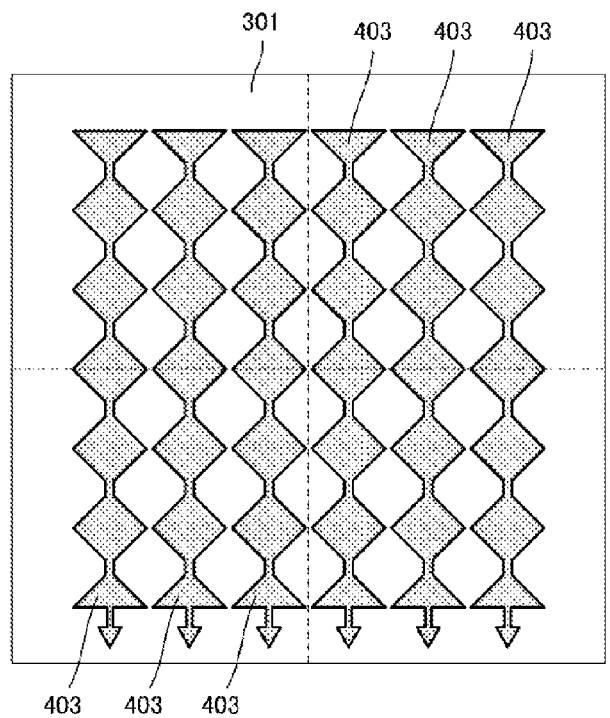
FIG. 17 is a plan view illustrating a structure of segment electrodes 403 of the panel 23.
Figure 18:
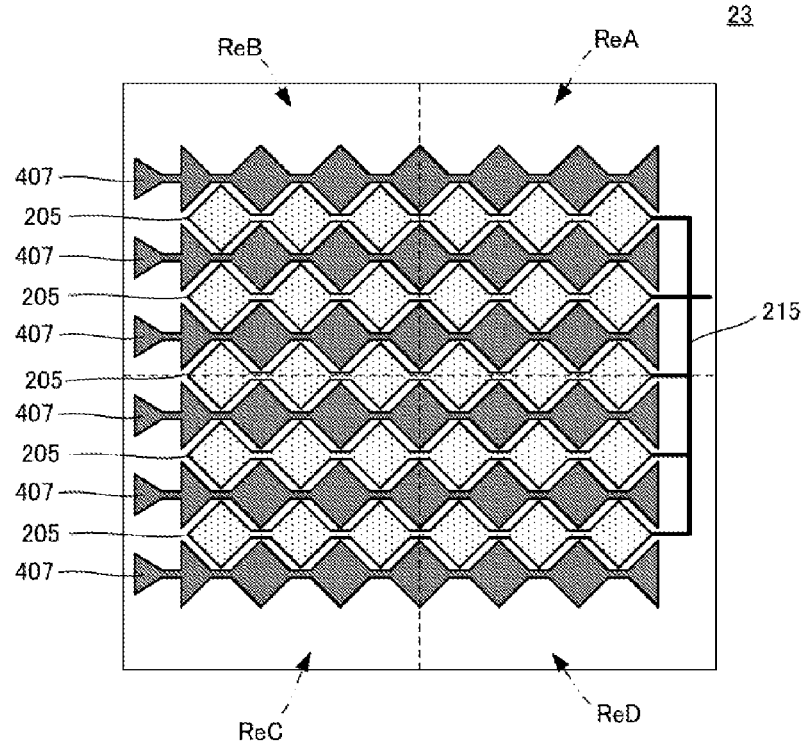
FIG. 18 is a plan view illustrating a structure of common electrodes 407 and displacement detection electrodes 205 of the panel 23.
Figure 19:
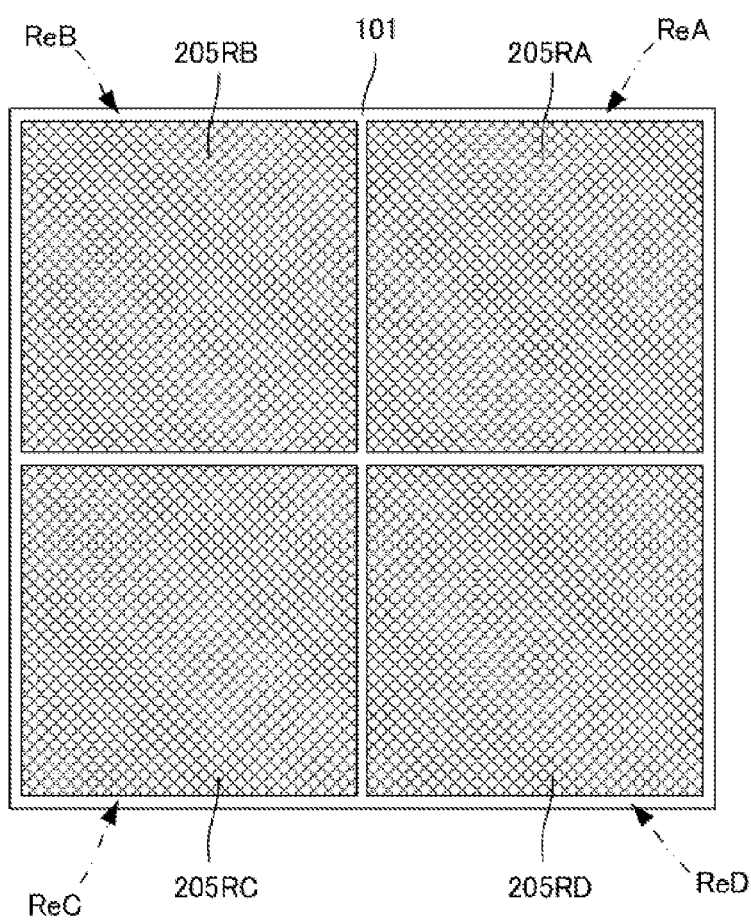
FIG. 19 is a back side view illustrating the structure of the panel 23.

FIG. 16 is a plan perspective view illustrating a structure of a panel 23 of the input terminal according to the third embodiment. FIG. 17 is a plan view illustrating a structure of segment electrodes 403 of the panel 23. FIG. 18 is a plan view illustrating a structure of common electrodes 407 and displacement detection electrodes 205 of the panel 23. FIG. 19 is a back side view illustrating the structure of the panel 23. In this regard, FIGS. 17, 18 and 19 do not illustrate a base substrate and rigid bodies. Schematically, the common electrodes 407 for a capacitive sensor and the displacement detection electrodes 205 for a piezoelectric sensor of the panel 23 according to the present embodiment are formed in the same layer.

A plurality of segment electrodes 403 whose schematic shapes are elongated shapes is formed aligning on a fifth principal surface which is one principal surface of a base film 301. The plurality of segment electrodes 403 is formed aligning along a direction orthogonal to an elongation direction. Each segment electrode 403 is formed in a shape which alternately connects a wide width portion and a narrow width portion along the elongation direction.

A plurality of common electrodes 407 whose schematic shapes are elongated shapes is formed aligning on a sixth principal surface which is the other principal surface of the base film 301. The plurality of common electrodes 407 is formed aligning along a direction orthogonal to the elongation direction. Each common electrode 407 is formed in a shape which alternately connects a wide width portion and a narrow width portion along the elongation direction. The elongation direction of the common electrodes 407 and the elongation direction of the segment electrodes 403 are orthogonal when seen from a direction in which a piezoelectric film 101 is seen from the plan view.

The displacement detection electrodes 205 whose schematic shapes are elongated shapes are formed on a third principal surface which is one principal surface of the piezoelectric film 101. A plurality of displacement detection electrodes 205 is formed aligning along a direction orthogonal to the elongation direction. Each displacement detection electrode 205 is formed in a shape which alternately connects a wide width portion and a narrow width portion along the elongation direction. Each displacement detection electrode 205 is connected by a lead-around electrode 215. The elongation direction of the displacement detection electrodes 205 is parallel to the elongation direction of the common electrodes 407 and orthogonal to the elongation direction of the segment electrodes 403 when seen from the direction in which the piezoelectric film 101 is seen from the plan view. Further, the displacement detection electrodes 205 and the common electrodes 407 are alternately formed aligning along a direction orthogonal to the elongation direction when seen from the direction in which the piezoelectric film 101 is seen from the plan view.

The panel 23 according to the present embodiment is configured such that the sixth principal surface of the base film 301 and the third principal surface of the piezoelectric film 101 are pasted facing each other, and therefore the common electrodes 407 and the displacement detection electrodes 205 are provided in the same layer (see FIG. 18). The wide width portions of the common electrodes 407 and the narrow width portions of the displacement detection electrodes 205, and the narrow width portions of the common electrodes 407 and the wide width portions of the displacement detection electrodes 205 are alternately disposed along the elongation direction like a mosaic pattern. Thus, the displacement detection electrodes 205 adopt structures which do not overlap the common electrodes 407 when seen from the direction in which the piezoelectric film 101 is seen from the plan view. In addition, the displacement detection electrodes 205 adopt structures in which nearly entire surfaces of the displacement detection electrodes 205 overlap the segment electrodes 403 when seen from the direction in which the piezoelectric film 101 is seen from the plan view.

A displacement detection electrode 205RA, a displacement detection electrode 205RB, a displacement detection electrode 205RC and a displacement detection electrode 205RD are formed on a fourth principal surface which is the other principal surface of the piezoelectric film 101. The displacement detection electrode 205RA is formed at a position at which a nearly entire surface of the displacement detection electrode 205RA opposes to the displacement detection electrodes 205. The displacement detection electrode 205RB is formed at a position at which a nearly entire surface of the displacement detection electrode 205RB opposes to the displacement detection electrodes 205. The displacement detection electrode 205RC is formed at a position at which a nearly entire surface of the displacement detection electrode 205RC opposes to the displacement detection electrodes 205. The displacement detection electrode 205RD is formed at a position at which a nearly entire surface of the displacement detection electrode 205RD opposes to the displacement detection electrodes 205.

Even according such a configuration, it is possible to enable an operation input based on a touch position and an operation input based on a displacement of the input terminal similar to the above embodiment. Further, by using the configuration according to the present embodiment, it is possible to make the panel 23 and the input terminal thinner since the common electrodes 407 for the capacitive sensor and the displacement detection electrodes 205 for the piezoelectric sensor are formed in the same layer. Furthermore, an electrode layer becomes thin in a layer direction, so that transparency increases when the input terminal is made transparent.

An example where the displacement detection electrodes 205 are common electrodes partially overlapping all of the displacement detection electrode 205RA, the displacement detection electrode 205RB, the displacement detection electrode 205RC and the displacement detection electrode 205RD formed on four displacement detection areas when seen from the direction in which the piezoelectric film 101 is seen from the plan view has been described above. However, the present invention is not limited to this configuration, and this configuration may be optionally changed. For example, the displacement detection electrodes formed on the third principal surface of the piezoelectric film 101 may form an electrode pattern to make it possible to detect a voltage caused by a displacement per divided area, or may form an electrode pattern to make it possible to detect a voltage caused by a displacement over a plurality of divided areas. According to this configuration it is possible to not only provide the above function and effect and appropriately set a sensitivity of the piezoelectric film for a displacement which needs to be detected.

Other Embodiments

In addition, an example where PLLA is used for a piezoelectric film has been described in the above embodiments. However, PDLA, poly-γ-methyl glutamate, poly-γ-benzyl glutamate, cellulose, collagen and poly-D-propylene oxide can also be used.

Further, examples where shapes of a panel, a base substrate and the like are rectangular when seen from a direction in which a piezoelectric film 101 is seen from a plan view have been described in the above embodiments. However, the present invention is not limited to this configuration. The shapes of the panel, the base substrate and the like may be optionally changed as long as rigid bodies can partially prevent a deformation caused by a twist of the base substrate.

Further, the examples where the displacement detection areas are set to four areas have been described in the above embodiments. However, the number of areas to set is not limited to this and needs to be plural as long as the areas have a predetermined positional relationship with respect to a uniaxial stretching direction.

DESCRIPTION OF REFERENCE SYMBOLS

1: INPUT TERMINAL
12: PIEZOELECTRIC SENSOR
13: CAPACITIVE SENSOR
14: DISPLACEMENT DETECTING UNIT
15: TOUCH POSITION DETECTING UNIT
16: OPERATION CONTENTS ANALYZING UNIT
20, 21A, 21B, 22, 23: PANEL
101: PIEZOELECTRIC FILM
121: ReA VOLTAGE DETECTING UNIT
122: ReB VOLTAGE DETECTING UNIT
123: ReC VOLTAGE DETECTING UNIT
124: ReD VOLTAGE DETECTING UNIT
201, 202, 203, 204, 201R, 202R, 203R, 204R, 201A, 202B, 203C, 204D, 201RA, 202RB, 203RC, 204RD, 205, 205RA, 205RB, 205RC, 205RD: DISPLACEMENT DETECTION ELECTRODE
211A, 211RA, 212B, 212RB, 213C, 213RC, 214D, 214RD, 215: LEAD-AROUND ELECTRODE
301: BASE FILM
401, 402, 403: SEGMENT ELECTRODE
405, 406, 407: COMMON ELECTRODE
501: BASE SUBSTRATE
502, 503: PROTECTION FILM
601, 601R: RIGID BODY
900: UNIAXIAL STRETCHING DIRECTION

The invention claimed is:
1. An input terminal comprising:
a base substrate having a first principal surface and a second principal surface opposing each other;
a piezoelectric film having a third principal surface and a fourth principal surface opposing each other, the third principal surface facing the second principal surface of the base substrate;
a first displacement detection electrode facing the third principal surface of the piezoelectric film;
a second displacement detecting electrode facing the fourth principal surface of the piezoelectric film, the first and second displacement detecting electrodes detecting a voltage produced by a bend displacement of the piezoelectric film;
a first set of rigid bodies disposed at a first end of the first principal surface and the second principal surface of the base substrate; and
a second set of rigid bodies disposed at a second end of the first principal surface and the second principal surface of the base substrate, the first set and second set of rigid bodies respectively opposing to each other across the base substrate to partially prevent a deformation caused by a twist of the base substrate.

2. The input terminal according to claim 1, wherein the first displacement detection electrode is divided into a plurality of first areas, and
the second displacement detection electrode is divided into a plurality of second areas.

3. The input terminal according to claim 2, wherein each of the plurality of first areas opposes a respective one of the plurality of second areas across the piezoelectric film, each of the opposed pairs of first and second areas detecting a respective voltage produced by a bend displacement of the piezoelectric film.

4. The input terminal according to claim 1, wherein the first displacement detection electrode is divided into a plurality of first areas along a first direction of the third principal surface or the fourth principal surface, and is divided into a plurality of second areas along a second direction orthogonal to the first direction, and
the second displacement detection electrode is divided into a plurality of third areas along the first direction, and is divided into a plurality of fourth areas along the second direction.

5. The input terminal according to claim 4, wherein the piezoelectric film is made of polylactic acid that was uniaxially stretched in a direction parallel to the third principal surface and the fourth principal surface, and
a direction of the uniaxially stretching of the piezoelectric film is a direction which forms a predetermined angle with respect to the first direction and the second direction.

6. The input terminal according to claim 1, further comprising a touch position detection panel including a main body having a fifth principal surface as an operation surface and a sixth principal surface opposing to the fifth principal surface, first capacitance detection electrodes facing the fifth principal surface and second capacitance detection electrodes facing the sixth principal surface.

7. The input terminal according to claim 6, wherein the third principal surface and the fourth principal surface, and the fifth principal surface and the sixth principal surface are positioned so as to overlap each other when viewed from the operation surface.

8. An input terminal comprising:
a piezoelectric film having a first principal surface and a second principal surface opposing each other;
a first displacement detection electrode facing the first principal surface of the piezoelectric film;
a second displacement detecting electrode facing the second principal surface of the piezoelectric film, the first and second displacement detecting electrodes detecting a voltage produced by a bend displacement of the piezoelectric film;
a first set of rigid bodies disposed at a first end of the first principal surface and the second principal surface of the piezoelectric film; and
a second set of rigid bodies disposed at a second end of the first principal surface and the second principal surface of the piezoelectric film, the first set and second set of rigid bodies respectively opposing to each other across the piezoelectric film to partially prevent a deformation caused by a twist of the piezoelectric film.

9. The input terminal according to claim 8, wherein the first displacement detection electrode is divided into a plurality of first areas, and
the second displacement detection electrode is divided into a plurality of second areas.

10. The input terminal according to claim 9, wherein each of the plurality of first areas opposes a respective one of the plurality of second areas across the piezoelectric film, each of the opposed pairs of first and second areas detecting a respective voltage produced by a bend displacement of the piezoelectric film.

11. The input terminal according to claim 8, wherein the first displacement detection electrode is divided into a plurality of first areas along a first direction of the first principal surface or the second principal surface, and is divided into a plurality of second areas along a second direction orthogonal to the first direction, and
the second displacement detection electrode is divided into a plurality of third areas along the first direction, and is divided into a plurality of fourth areas along the second direction.

12. The input terminal according to claim 11, wherein the piezoelectric film is made of polylactic acid that was uniaxially stretched in a direction parallel to the first principal surface and the second principal surface, and
a direction of the uniaxially stretching of the piezoelectric film is a direction which forms a predetermined angle with respect to the first direction and the second direction.

13. The input terminal according to claim 8, further comprising first capacitance detection electrodes facing the first principal surface and second capacitance detection electrodes facing the second principal surface.

14. The input terminal according to claim 13, wherein the first capacitance detection electrode and the first displacement detection electrode are formed on a first identical plane, and the second capacitance detection electrode and the second displacement detection electrode are formed on a second identical plane.

15. An input terminal comprising:
a base substrate having a first principal surface and a second principal surface opposing each other;
a piezoelectric film having a third principal surface and a fourth principal surface opposing each other, the third principal surface facing the second principal surface of the base substrate;
a first displacement detection electrode facing the third principal surface of the piezoelectric film;
a second displacement detection electrode facing the fourth principal surface of the piezoelectric film, the first and second displacement detecting electrodes detecting a voltage produced by a bend displacement of the piezoelectric film;
a first set of rigid bodies disposed at a first end of the first principal surface and the second principal surface of the base substrate; and
a second set of rigid bodies disposed at a second end of the first principal surface and the second principal surface of the base substrate, the first set and second set of rigid bodies respectively opposing to each other across the base substrate and extending in a direction intersecting a direction of a deformation caused by a twist of the base substrate.

16. The input terminal according to claim 15, wherein the first displacement detection electrode is divided into a plurality of first areas, and
the second displacement detection electrode is divided into a plurality of second areas.

17. The input terminal according to claim 16, wherein each of the plurality of first areas opposes a respective one of the plurality of second areas across the piezoelectric film, each of the opposed pairs of first and second areas detecting a respective voltage produced by a bend displacement of the piezoelectric film.

18. The input terminal according to claim 15, wherein the first displacement detection electrode is divided into a plurality of first areas along a first direction of the third principal surface or the fourth principal surface, and is divided into a plurality of second areas along a second direction orthogonal to the first direction, and
the second displacement detection electrode is divided into a plurality of third areas along the first direction, and is divided into a plurality of fourth areas along the second direction.

19. The input terminal according to claim 18, wherein the piezoelectric film is made of polylactic acid that was uniaxially stretched in a direction parallel to the third principal surface and the fourth principal surface, and a direction of the uniaxially stretching of the piezoelectric film is a direction which forms a predetermined angle with respect to the first direction and the second direction.

20. The input terminal according to claim 15, further comprising a touch position detection panel including a main body having a fifth principal surface as an operation surface and a sixth principal surface opposing to the fifth principal surface, first capacitance detection electrodes facing the fifth principal surface and second capacitance detection electrodes facing the sixth principal surface.

* * * * *